(12) United States Patent
Kagawa

(10) Patent No.: US 10,985,026 B2
(45) Date of Patent: Apr. 20, 2021

(54) SUBSTRATE PROCESSING METHOD, SUBSTRATE PROCESSING APPARATUS, AND SUBSTRATE PROCESSING SYSTEM

(71) Applicant: TOKYO ELECTRON LIMITED, Tokyo (JP)

(72) Inventor: Koji Kagawa, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/409,220

(22) Filed: May 10, 2019

(65) Prior Publication Data
US 2019/0348293 A1 Nov. 14, 2019

(30) Foreign Application Priority Data

May 14, 2018 (JP) .............................. JP2018-092753

(51) Int. Cl.
| | | |
|---|---|---|
| *H01L 21/308* | (2006.01) | |
| *H01L 21/687* | (2006.01) | |
| *H01L 21/033* | (2006.01) | |
| *H01L 21/67* | (2006.01) | |

(52) U.S. Cl.
CPC ...... *H01L 21/3086* (2013.01); *H01L 21/0332* (2013.01); *H01L 21/0337* (2013.01); *H01L 21/3081* (2013.01); *H01L 21/67069* (2013.01); *H01L 21/68714* (2013.01)

(58) Field of Classification Search
CPC ............. H01L 21/3086; H01L 21/3081; H01L 21/68714; H01L 21/0332; H01L 21/67069; H01L 21/0337; H01L 21/31111; H01L 21/0223; H01L 21/31144; H01L 21/67057; H01L 21/67173; H01L 21/67028; H01L 21/67103; H01L 21/67051; H01L 21/308; H01L 21/306; H01L 21/67023; H01L 21/67063
USPC ..................................... 438/706–714; 216/83
See application file for complete search history.

(56) References Cited

U.S. PATENT DOCUMENTS

| | | | | |
|---|---|---|---|---|
| 5,358,890 | A * | 10/1994 | Sivan ..................... | H01L 21/32 257/E21.258 |
| 6,187,216 | B1 * | 2/2001 | Dryer ................ | H01L 21/67086 216/95 |
| 2015/0262737 | A1 * | 9/2015 | Hinode ............. | H01L 21/67017 216/83 |
| 2015/0287591 | A1 * | 10/2015 | Pore ........................ | C23C 16/30 438/778 |
| 2015/0357197 | A1 * | 12/2015 | Peethala ........... | H01L 21/30604 438/749 |

(Continued)

FOREIGN PATENT DOCUMENTS

JP    2000133710 A    5/2000

*Primary Examiner* — Duy Vu N Deo
(74) *Attorney, Agent, or Firm* — Nath, Goldberg & Meyer; Jerald L. Meyer

(57) ABSTRACT

There is provided a method of processing a substrate, the method including: a production process of producing $B(OH)_3$ or $B_2O_3$ by bringing an oxidizing agent into contact with a boron-based film in a substrate in which the boron-based film is formed on a film including a silicon-based film; and a removal process of removing the boron-based film from the substrate by dissolving the $B(OH)_3$ or $B_2O_3$ produced in the production process in water.

2 Claims, 19 Drawing Sheets

| $H_2O_2 : H_2O$ | Temperature / $H_2O_2$ Concentration | Etching rate (processing time) | | |
|---|---|---|---|---|
| | | 75°C | 85°C | 95°C |
| 1:0 | 31wt% | 4.0nm/min (150min) | 10.8nm/min (56min) | 30.2nm/min (20min) |
| 3:1 | 23.9wt% | 4.4nm/min (136min) | 20.1nm/min (30min) | – |
| 1:1 | 16.5wt% | 1.8nm/min (333min) | 8.8nm/min (68min) | 22.6nm/min (27min) |
| 1:3 | 8.5wt% | 0.5nm/min (1200min) | 1.4nm/min (429min) | – |

(56) References Cited

U.S. PATENT DOCUMENTS

2018/0174838 A1\* 6/2018 Ueda ................. C23C 16/38
2018/0182638 A1\* 6/2018 Kagawa ............. H01L 21/0209

\* cited by examiner

| $H_2O_2:H_2O$ | $H_2O_2$ Concentration | Etching rate (processing time) | | |
|---|---|---|---|---|
| | | 75°C | 85°C | 95°C |
| 1:0 | 31wt% | 4.0nm/min (150min) | 10.8nm/min (56min) | 30.2nm/min (20min) |
| 3:1 | 23.9wt% | 4.4nm/min (136min) | 20.1nm/min (30min) | - |
| 1:1 | 16.5wt% | 1.8nm/min (333min) | 8.8nm/min (68min) | 22.6nm/min (27min) |
| 1:3 | 8.5wt% | 0.5nm/min (1200min) | 1.4nm/min (429min) | - |

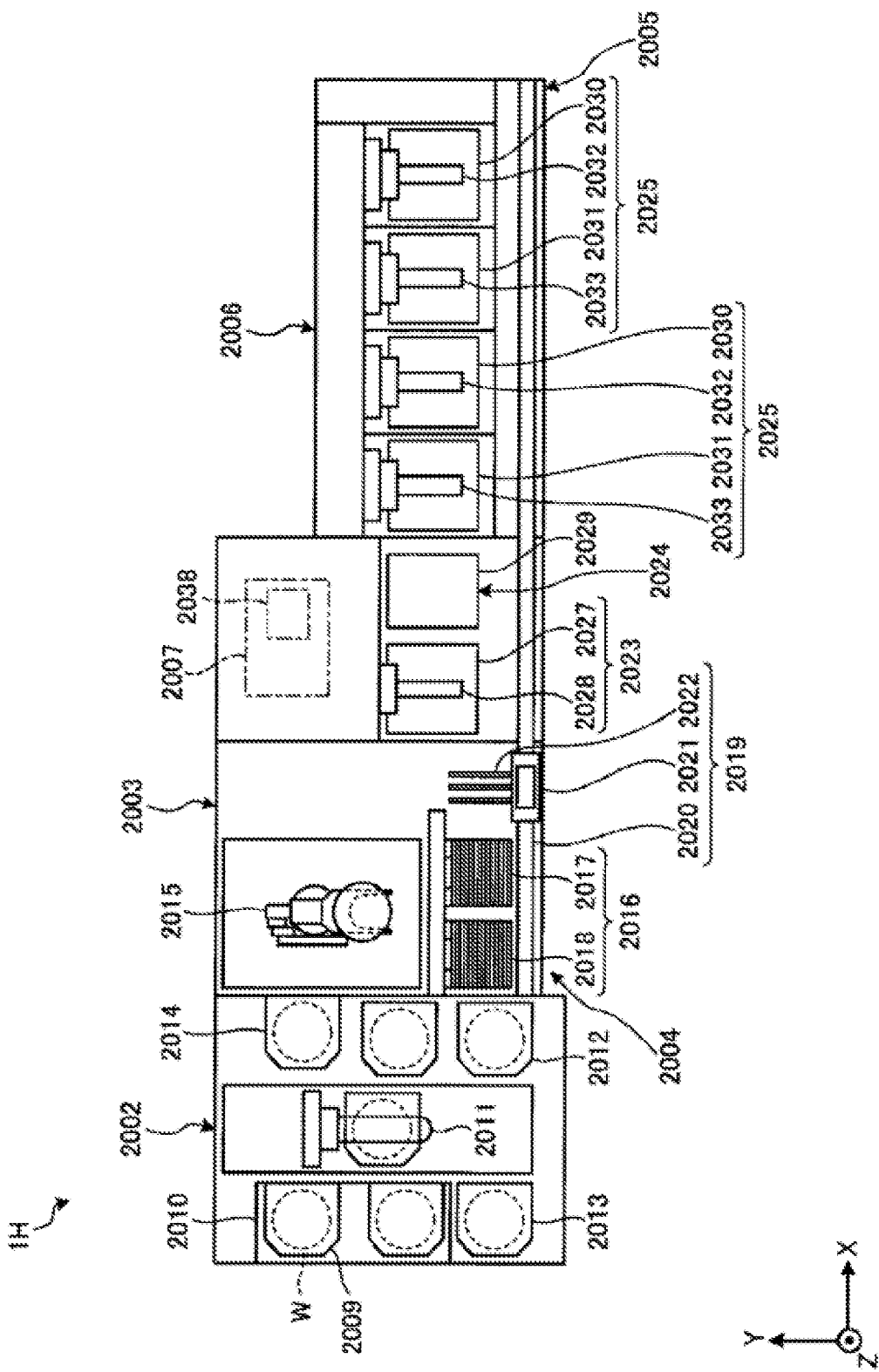

SUBSTRATE PROCESSING METHOD, SUBSTRATE PROCESSING APPARATUS, AND SUBSTRATE PROCESSING SYSTEM

CROSS-REFERENCE TO RELATED APPLICATION

This application is based upon and claims the benefit of priority from Japanese Patent Application No. 2018-092753, filed on May 14, 2018, the entire contents of which are incorporated herein by reference.

TECHNICAL FIELD

The present disclosure relates to a substrate processing method, a substrate processing apparatus, and a substrate processing system.

BACKGROUND

In the related art, a carbon film or the like is utilized as a hard mask when etching a semiconductor substrate.

In recent years, boron-based films have received a lot of attention as new materials of the hard mask.

SUMMARY

Some embodiments of the present disclosure provide a technique for appropriately removing a boron-based film from a substrate.

According to one embodiment of the present disclosure, there is provided a method of processing a substrate, the method including: a production process of producing $B(OH)_3$ or $B_2O_3$ by bringing an oxidizing agent into contact with a boron-based film in a substrate in which the boron-based film is formed on a film including a silicon-based film; and a removal process of removing the boron-based film from the substrate by dissolving the $B(OH)_3$ or $B_2O_3$ produced in the production process in water.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 19 is a view illustrating an exemplary configuration of a substrate processing apparatus according to a seventh embodiment of the present disclosure.

DETAILED DESCRIPTION

Figure 1A:
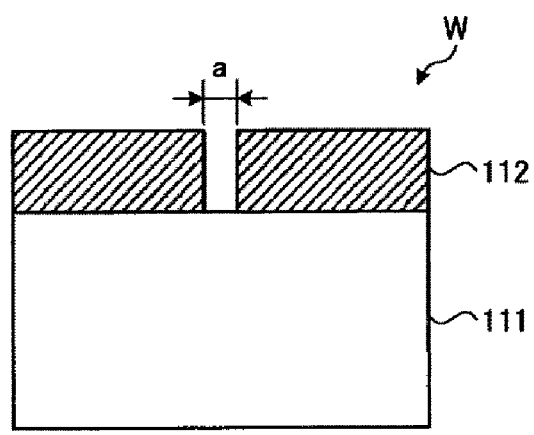
FIG. 1A is a view illustrating an example of a substrate processing method according to a first embodiment of the present disclosure.

Hereinafter, modes (hereinafter, referred to as "embodiments") for carrying out a substrate processing method, a substrate processing apparatus, and a substrate processing system according to the present disclosure will be described in detail with reference to the drawings. Further, the substrate processing method, the substrate processing apparatus, and the substrate processing system according to the present disclosure are not limited to such embodiments. In addition, processing contents described in the respective embodiments may be appropriately combined unless a conflict arises. Further, in the following respective embodiments, like parts are given like reference numerals and a repeated description will be omitted.

In recent years, boron-based films have received a lot of attention as new materials of a hard mask. Among these boron-based films, a boron-based film has higher selectivity than conventional hard masks. Specifically, the boron-based film is hardly etched under etching conditions of a silicon oxide film. This makes it possible to etch the silicon oxide film at high selectivity with respect to the boron-based film.

However, a technique for removing a boron-based film as formed from a substrate in an effective manner has not been disclosed. Therefore, there is a need to provide a technique for appropriately removing a boron-based film from a substrate.

First Embodiment

[Substrate Processing Method]

First, an example of a substrate processing method according to a first embodiment of the present disclosure will be described with reference to FIGS. 1A to 1D. FIGS. 1A to 1D are views illustrating the example of the substrate processing method according to the first embodiment.

The substrate processing method according to the first embodiment is applied to a semiconductor substrate (hereinafter, simply referred to as a "wafer") such as a silicon wafer having a film including a silicon-based film.

In order to facilitate understanding, a case where a wafer having only a silicon oxide film ($SiO_2$ film) as a silicon-based film is considered will be described here. However, the wafer may have a film other than the silicon oxide film. The silicon-based film is not limited to the silicon oxide film but may be an SiN film, a polysilicon film, or the like.

As illustrated in FIG. 1A, in the substrate processing method according to the first embodiment, first, a boron-based film 112 is formed on a silicon oxide film 111 of the wafer W (in a film forming process).

The boron-based film 112 is a film substantially consisting of boron (B) alone. In addition, the boron-based film 112 may contain inevitable impurities which are unavoidably mixed in the film forming process to the extent that they are unavoidably mixed. An example of the inevitable impurities may include hydrogen (H), oxygen (O), carbon (C), or the like.

Figure 1B:
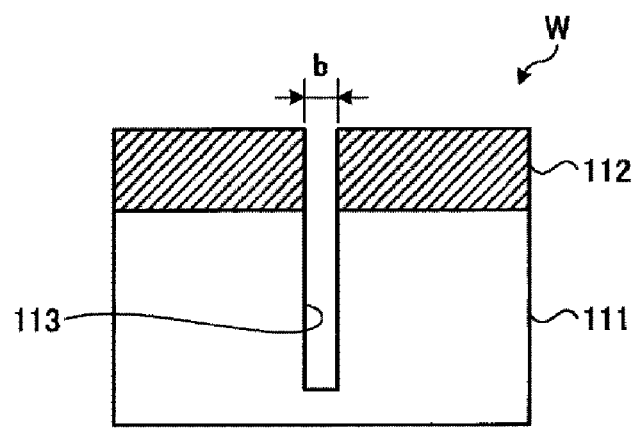
FIG. 1B is a view illustrating an example of the substrate processing method according to the first embodiment.

Subsequently, as illustrated in FIG. 1B, in the substrate processing method according to the first embodiment, the wafer W after the film forming process is etched (in an etching process).

Specifically, in the etching process, a recess (trench) 113 is formed to have a depth of, e.g., 500 nm or more, in the depth direction of the silicon oxide film 111 using the boron-based film 112 formed in the film forming process as a hard mask.

The boron-based film 112 is hardly etched under etching conditions of the silicon oxide film 111. Thus, the silicon oxide film 111 can be etched at high selectivity with respect to the boron-based film 112. Therefore, even if the depth of the recess 113 is 500 nm or more, an opening width b of the recess 113 can be prevented from excessively expanding relative to an opening width a of the boron-based film 112.

Figure 1C:
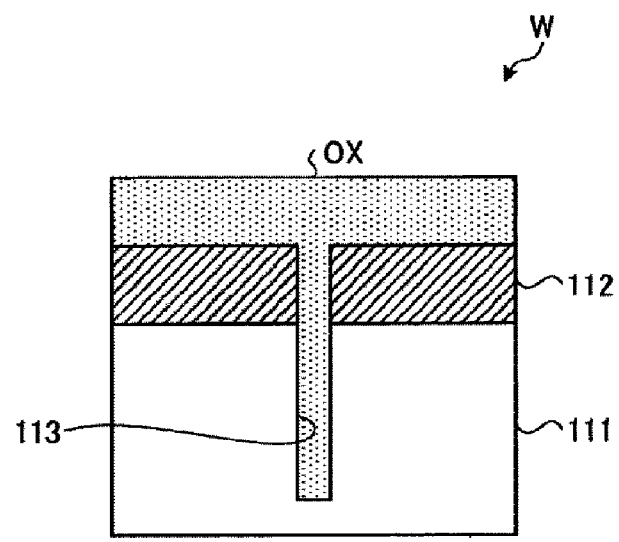
FIG. 1C is a view illustrating an example of the substrate processing method according to the first embodiment.

Subsequently, as illustrated in FIG. 1C, in the substrate processing method according to the first embodiment, the boron-based film 112 is removed from the wafer W after the etching process.

Specifically, first, $B(OH_3)$ or $B_2O_3$ is produced on the boron-based film 112 by bringing an oxidizing agent OX into contact with the boron-based film 112 on the wafer W (in a production process). Thereafter, the boron-based film 112 is removed from the wafer W by dissolving $B(OH_3)$ or $B_2O_3$ produced in the production process in water (in a removal process).

For example, an ozone-containing aqueous solution (hereinafter, referred to as "ozone water") may be used as the oxidizing agent OX. Ozone is decomposed into oxygen molecules in water. Hydroxy radicals (OH) are produced in the decomposition process. The hydroxy radicals are the strongest in oxidation power among active oxygens and reacts with boron to produce $B(OH_3)$ or $B_2O_3$. $B(OH_3)$ or $B_2O_3$ is dissolved in water contained in the ozone water because it has water solubility.

Figure 1D:
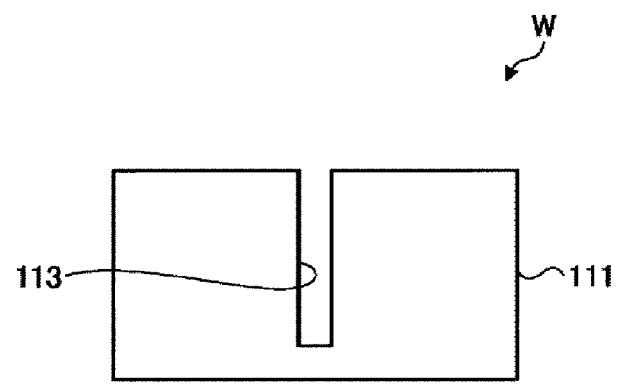
FIG. 1D is a view illustrating an example of the substrate processing method according to the first embodiment.

In this manner, $B(OH_3)$ or $B_2O_3$ is produced by bringing the ozone water into contact with the boron-based film 112, and the produced $B(OH_3)$ or $B_2O_3$ is dissolved in water contained in the ozone water. Thus, as illustrated in FIG. 1D, the boron-based film 112 can be removed from the wafer W.

The ozone water does not react with the silicon oxide film 111. Therefore, the boron-based film 112 can be removed from the wafer W while suppressing the influence on the silicon oxide film 111.

In order to increase the etching rate of the boron-based film 112, the ozone water may be heated. However, the hydroxy radicals have the property of being deactivated in a short period of time after they are produced. Thus, the higher the temperature, the higher the reactivity, while the deactivation time becomes shorter and the hydroxyl radicals may be deactivated before being supplied to the boron-based film 112. For this reason, it is preferable that the ozone water is heated immediately before being supplied to the wafer W.

The oxidizing agent is not limited to the ozone water but may be a hydrogen peroxide solution. When the hydrogen peroxide solution is brought into contact with the boron-based film 112, boron is oxidized by an oxidation action of the hydrogen peroxide to produce $B(OH_3)$ or $B_2O_3$. Thereafter, the wafer W is removed from the boron-based film 112 by dissolving the produced $B(OH_3)$ or $B_2O_3$ in water in the hydrogen peroxide solution.

In this manner, in the production process, $B(OH_3)$ or $B_2O_3$ may be produced by bringing the hydrogen peroxide solution into contact with the boron-based film 112, and in the removal process, the produced $B(OH_3)$ or $B_2O_3$ may be dissolved in water contained in the hydrogen peroxide solution. Thus, the boron-based film 112 can be appropriately removed from the wafer W by the same mechanism as that of the ozone water, namely a mechanism in which boron is oxidized to produce $B(OH_3)$ or $B_2O_3$ and the produced $B(OH_3)$ or $B_2O_3$ is dissolved in water.

Figures 2, 3:
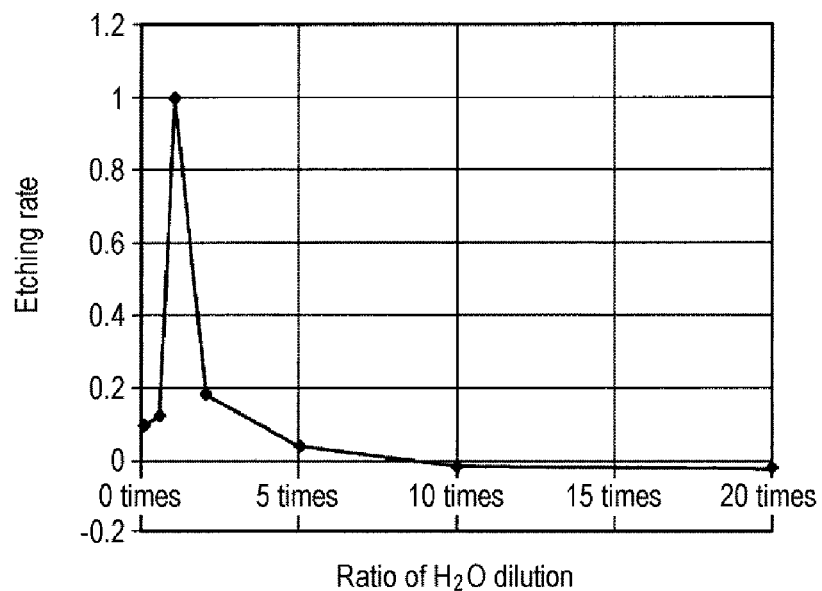
FIG. 2 is an experimental result illustrating a change in etching rate of a boron-based film when a ratio of hydrogen peroxide ($H_2O_2$) to water ($H_2O$) is changed.
FIG. 3 is an experimental result illustrating a change in etching rate of a boron-based film when a dilution magnification of a mixed solution is changed.

FIG. 2 is an experimental result illustrating a change in etching rate of the boron-based film 112 when a ratio of hydrogen peroxide ($H_2O_2$) to water ($H_2O$) is changed. In FIG. 2, "$H_2O_2:H_2O$" indicates a ratio of hydrogen peroxide (undiluted solution) of 31 wt % to water. Further, numerical values shown in parenthesis in FIG. 2 indicate supply times of the hydrogen peroxide solution. In the experiment, the boron-based film 112 having a film thickness of 600 nm was used as an etching target object.

As illustrated in FIG. 2, the etching rate of the hydrogen peroxide solution is the highest when the concentration of hydrogen peroxide is about 24 wt %, and was 20 nm/min when a processing temperature (a temperature of the hydrogen peroxide solution) is 85 degrees C.

On the other hand, as illustrated in FIG. 2, it was found that the etching rate was lowered when the concentration of hydrogen peroxide was lower than about 24 wt %. This is presumably because the oxidation action is weakened by the decrease of the ratio of hydrogen peroxide in the hydrogen peroxide solution. It was also found that the etching rate was lowered even when the concentration of hydrogen peroxide was higher than about 24 wt %. This is presumably because the ability to dissolve $B(OH)_3$ or $B_2O_3$ was weakened by the decrease of the ratio of water in the hydrogen peroxide solution.

As described above, when removing the boron-based film 112 using the hydrogen peroxide solution, the concentration of hydrogen peroxide in the hydrogen peroxide solution may fall within a range of from 16.5 wt % to 35 wt %. In such a range, the production of $B(OH)_3$ or $B_2O_3$ and the dissolution of the produced $B(OH)_3$ or $B_2O_3$ can be realized in a balanced manner, which makes it possible to appropriately remove the boron-based film 112 from the wafer W.

Furthermore, the oxidizing agent may be a mixed solution of a nitric acid ($HNO_3$), a strong acid stronger than the nitric acid, and water. For example, a sulfuric acid ($H_2SO_4$) may be used as the strong acid. In addition, for example, a carborane acid, a trifluoromethanesulfonic acid, or the like may be used as the strong acid. That is to say, by the definition of Bronsted, any acid may be used as long as it can give proton ($H^+$) to a nitric acid. The water is, for example, DIW. Also, an organic acid may be used instead of water or by mixture thereof. An example of the organic acid may include a formic acid (HCOOH) as a carboxylic acid, an oxalic acid $(COOH)_2$, an acetic acid ($CH_3COOH$), a propionic acid ($CH_3CH_2COOH$), a butyric acid ($CH_3(CH_2)_2COOH$), a valeric acid ($CH_3(CH_2)_3COOH$), or the like.

In such a mixed solution, the nitric acid undergoes dehydration by the strong acid to produce nitronium ions. The produced nitronium ions react with boron to produce $B(OH)_3$ or $B_2O_3$. Thereafter, the boron-based film 112 is removed from the wafer W by dissolving the produced $B(OH)_3$ or $B_2O_3$ in water in the mixed solution.

In this manner, in the production process, $B(OH)_3$ or $B_2O_3$ may be produced by bringing the mixed solution of the nitric acid, the strong acid stronger than the nitric acid, and water into contact with the boron-based film 112. Furthermore, in the removal process, the $B(OH)_3$ or $B_2O_3$ produced in the production process may be dissolved in water contained in the mixed solution. Thus, the boron-based film 112 can be appropriately removed from the wafer W by the same mechanism as that of the ozone water or the hydrogen peroxide solution.

In addition, if the concentration of the sulfuric acid in the mixed solution is 64 wt % or less and the concentration of the nitric acid falls within a range of from 3 wt % to 69 wt %, the aforementioned effects can be achieved. More specifically, the concentration of the sulfuric acid may be 50 wt % or less and the concentration of the nitric acid may fall within a range of from 3 wt % to 69 wt %.

FIG. 3 is an experimental result illustrating a change in etching rate of the boron-based film 112 when a dilution magnification of the mixed solution is changed. In a graph illustrated in FIG. 3, the horizontal axis indicates a dilution magnification when a mixed solution of 46 wt % of sulfuric acid and 3 wt % of nitric acid is diluted with water.

Therefore, for example, in the horizontal axis of FIG. 3, "one times" indicates a mixed solution itself of 46 wt % of sulfuric acid and 3 wt % of nitric acid, and "5 times" indicates that the mixed solution of 46 wt % of sulfuric acid and 3 wt % of nitric acid was diluted five times with water. Furthermore, "0 times" indicates a mixed solution of sulfuric acid and nitric acid, which does not contain water. The vertical axis in FIG. 3 indicates a relative value of an etching rate when the largest value among measured etching rates is 1.

As illustrated in FIG. 3, it can be seen that, when the mixed solution of sulfuric acid and nitric acid, which contains 46 wt % of sulfuric acid and 3 wt % of nitric acid, was diluted with water ranging from 0.45 times to 1.8 times, a very large etching rate is obtained, compared with the case where the mixed solution was diluted with water of other magnifications or in the dilution magnification of 0 times. More specifically, the etching rate of the boron-based film 112 was the highest when the aforementioned mixed solution was diluted with water of 0.9 times.

[Configuration of the Substrate Processing System]

Figure 4:
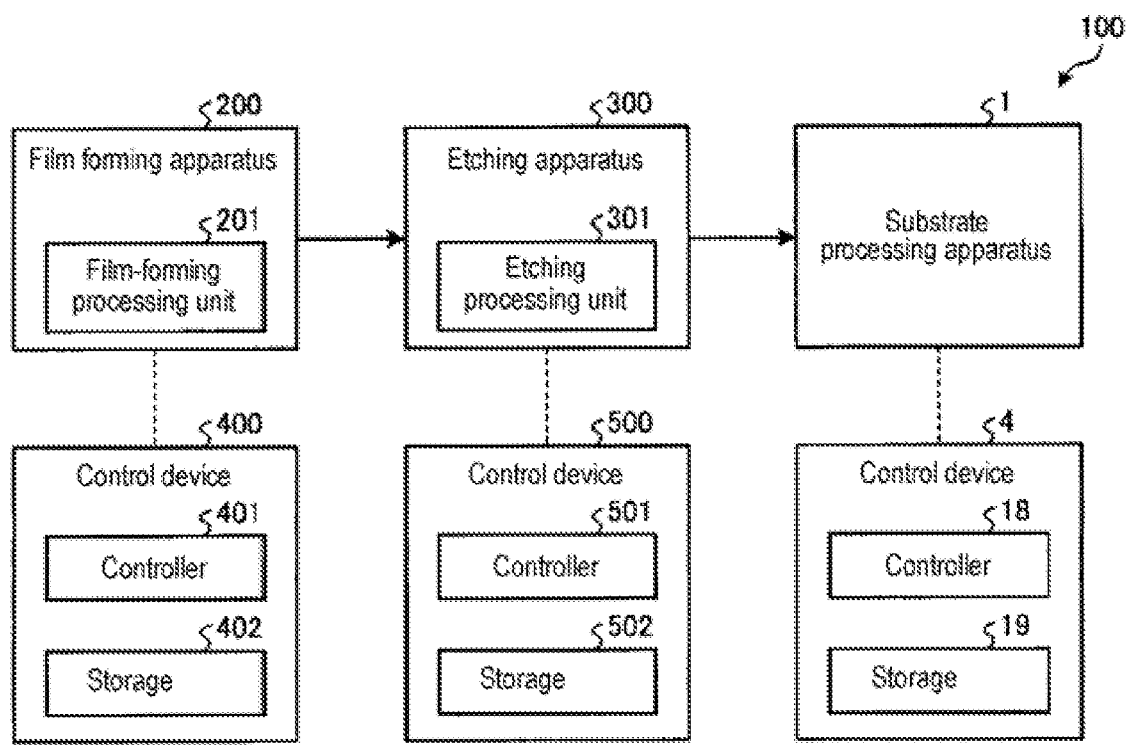
FIG. 4 is a block diagram illustrating an example of a substrate processing system according to the first embodiment.

Next, an exemplary configuration of the substrate processing system according to the first embodiment will be described with reference to FIG. 4. FIG. 4 is a block diagram illustrating the exemplary configuration of the substrate processing system according to the first embodiment. Furthermore, the aforementioned oxidizing agent, i.e., the ozone water, the hydrogen peroxide solution, and the mixed solution, may be collectively referred to sometimes as a "removal solution" hereinbelow.

As illustrated in FIG. 4, a substrate processing system 100 includes a film forming apparatus 200, an etching apparatus 300, and a substrate processing apparatus 1.

The film forming apparatus 200 is an apparatus that performs the film forming process described above. The film forming apparatus 200 includes a film-forming processing unit 201. A configuration of the film-forming processing unit 201 will be described later with reference to FIG. 5.

Although not shown in FIG. 4, the film forming apparatus 200 includes, in addition to the film-forming processing unit 201, for example, a stage on which the wafer W is mounted, a transfer device for transferring the wafer W mounted on the stage to the film-forming processing unit 201, and the like.

The etching apparatus 300 is an apparatus that performs the etching process described above. The etching apparatus 300 includes an etching processing unit 301. A configuration of the etching processing unit 301 will be described later with reference to FIG. 6.

Although not shown in FIG. 4, the etching apparatus 300 includes, in addition to the etching processing unit 301, for example, a stage on which the wafer W is mounted, or a transfer device for transferring the wafer W mounted on the stage to the etching processing unit 301, and the like.

The substrate processing apparatus 1 is an apparatus that performs the removal process described above. A configuration of the substrate processing apparatus 1 will be described later with reference to FIGS. 7 and 8, and the like.

Control devices 4, 400, and 500 are connected to the substrate processing apparatus 1, the film forming apparatus 200, and the etching apparatus 300, respectively. The control devices 4, 400, and 500 respectively include controllers 18, 401, and 501, and storages 19, 402, and 502.

Each of the controllers 18, 401, and 501 includes, for example, a microcomputer having a central processing unit (CPU), a read only memory (ROM), a random access memory (RAM), and input/output ports, or various circuits.

The controllers 18, 401, and 501 control operations of the substrate processing apparatus 1, the film forming apparatus 200, and the etching apparatus 300 by causing the respective CPU to execute a program stored in the ROM using the RAM as a work area, respectively.

The program is stored in a computer-readable recording medium, or may be installed on the respective storage of each control device from the recording medium. Examples of the computer-readable recording medium may include a hard disk (HD), a flexible disk (FD), a compact disc (CD), a magneto-optical disk (MO), a memory card, and the like.

Each of the storages 19, 402, and 502 is realized by, for example, a semiconductor memory device such as an RAM, a flash memory or the like, or a memory such as a hard disk or an optical disc.

[Configuration of the Film-Forming Processing Unit]

Figure 5:
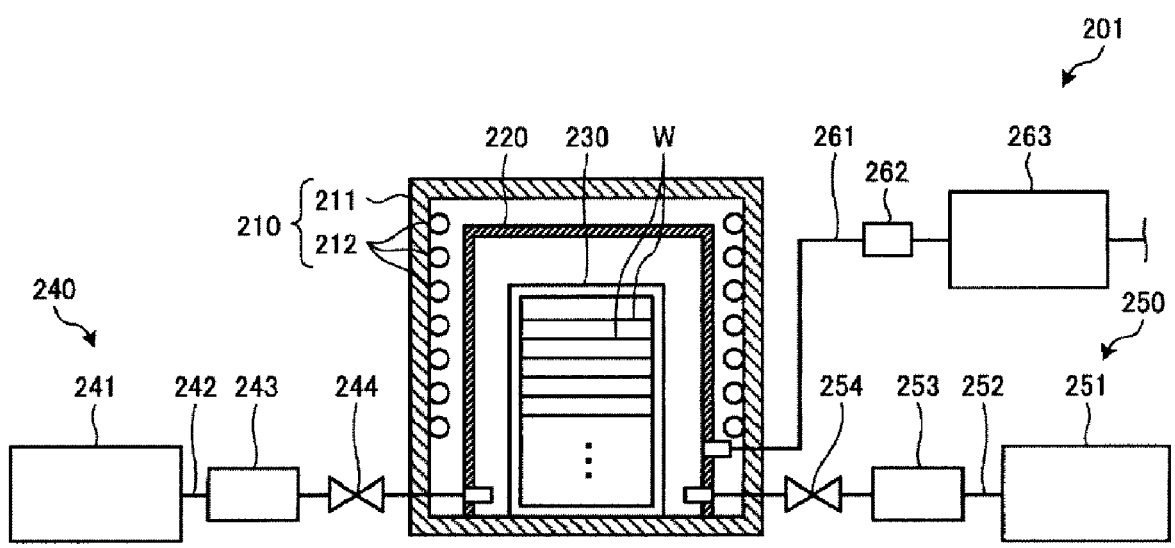
FIG. 5 is a diagram illustrating an exemplary configuration of a film-forming processing unit.

Next, an exemplary configuration of the film-forming processing unit 201 included in the film forming apparatus 200 will be described with reference to FIG. 5. FIG. 5 is a diagram illustrating the exemplary configuration of the film-forming processing unit 201.

As illustrated in FIG. 5, the film-forming processing unit 201 is configured as a batch-type processing apparatus capable of processing a plurality of, e.g., 50 to 150 sheets of wafers W, in a batch manner The film-forming processing unit 201 includes a heating furnace 210 having a cylindrical heat insulator 211 with a ceiling portion, and a heater 212 provided on an inner peripheral surface of the heat insulator 211.

A processing container 220 made of, e.g., quartz, is inserted inside the heating furnace 210. The heater 212 is provided to surround the outer side of the processing container 220.

A wafer boat 230 is disposed inside the processing container 220. The wafer boat 230 is made of quartz, and accommodates, for example, 50 to 150 sheets of wafers W, which are stacked at predetermined pitches and intervals. The wafer boat 230 can be moved up and down by an elevating mechanism (not shown) so as to be loaded into and unloaded from the processing container 220.

In addition, the film-forming processing unit 201 includes a boron-containing gas supply mechanism 240 configured to introduce, for example, a $B_2H_6$ gas as a boron-containing gas which is a film-forming raw material gas, into the processing container 220. Furthermore, the film-forming processing unit 201 includes an inert gas supply mechanism 250 configured to introduce an inert gas used as a purge gas or the like into the processing container 220.

The boron-containing gas supply mechanism 240 includes a boron-containing gas source 241 configured to supply the boron-containing gas, for example, a $B_2H_6$ gas, as the film-forming raw material gas. In addition, the boron-containing gas supply mechanism 240 includes a film-forming gas pipe 242 through which the film-forming gas flows from the boron-containing gas source 241 into the processing container 220. A flow rate controller 243 and an opening/closing valve 244 are provided in the film-forming gas pipe 242.

The inert gas supply mechanism 250 includes an inert gas source 251, and an inert gas pipe 252 through which the inert gas flows from the inert gas source 251 to the processing container 220. A flow rate controller 253 such as a mass flow controller and an opening/closing valve 254 are provided in the inert gas pipe 252. A noble gas such as an $N_2$ gas or an Ar gas may be used as the inert gas.

In addition, an exhaust pipe 261 is connected to the processing container 220. A vacuum pump 263 is coupled to the exhaust pipe 261 via a pressure regulation mechanism 262 including a pressure regulation valve and the like. Thus, the interior of the processing container 220 can be adjusted to have a predetermined pressure by the pressure regulation mechanism 262 while exhausting the interior of the processing container 220 by the vacuum pump 263.

[Configuration of the Etching Processing Unit]

Figure 6:
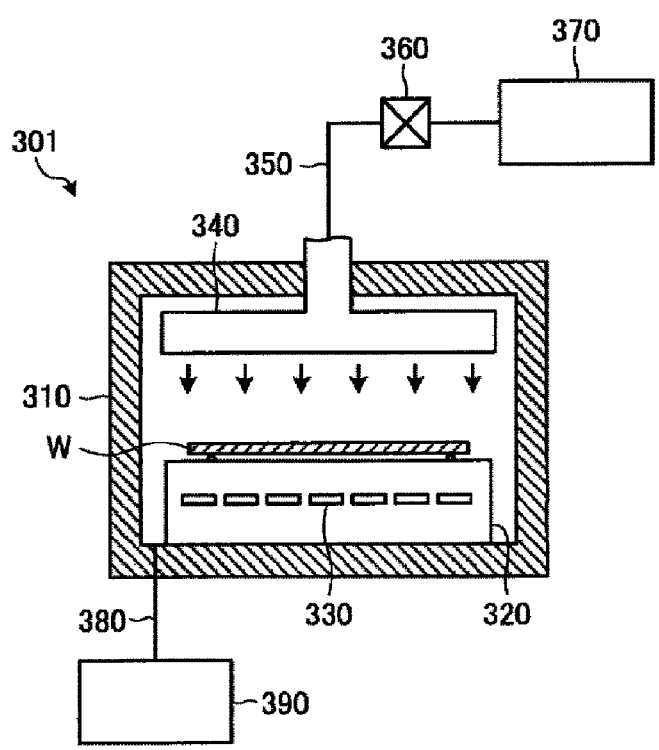
FIG. 6 is a diagram illustrating an exemplary configuration of an etching processing unit.

Next, a configuration of the etching processing unit 301 included in the etching apparatus 300 will be described with reference to FIG. 6. FIG. 6 is a diagram illustrating an example of the configuration of the etching processing unit 301.

As illustrated in FIG. 6, the etching processing unit 301 includes a chamber 310 having a hermetically sealed structure and configured to accommodate the wafer W. A stage 320 on which the wafer W is mounted in a horizontal posture is provided inside the chamber 310. The stage 320 includes a temperature control mechanism 330 configured to adjust a temperature of the wafer W to a predetermined temperature by cooling down or heating the wafer W. A loading/unloading port (not shown) through which the wafer W is loaded into or unloaded from the chamber 310, is formed in a sidewall of the chamber 310.

A shower head 340 is provided in a ceiling portion of the chamber 310. A gas supply pipe 350 is connected to the shower head 340. An etching gas source 370 is coupled to the gas supply pipe 350 via a valve 360. A predetermined etching gas is supplied from the etching gas source 370 into the shower head 340. The shower head 340 supplies the etching gas supplied from the etching gas source 370 into the chamber 310.

An example of the etching gas supplied from the etching gas source 370 may include a $CH_3F$ gas, a $CH_2F_2$ gas, a $CF_4$ gas, an $O_2$ gas, an Ar gas, or the like.

An exhaust device 390 is coupled to the bottom of the chamber 310 via an exhaust line 380. An internal pressure of the chamber 310 is kept in a depressurized state by the exhaust device 390.

[Configuration of the Substrate Processing Apparatus]

Figure 7:
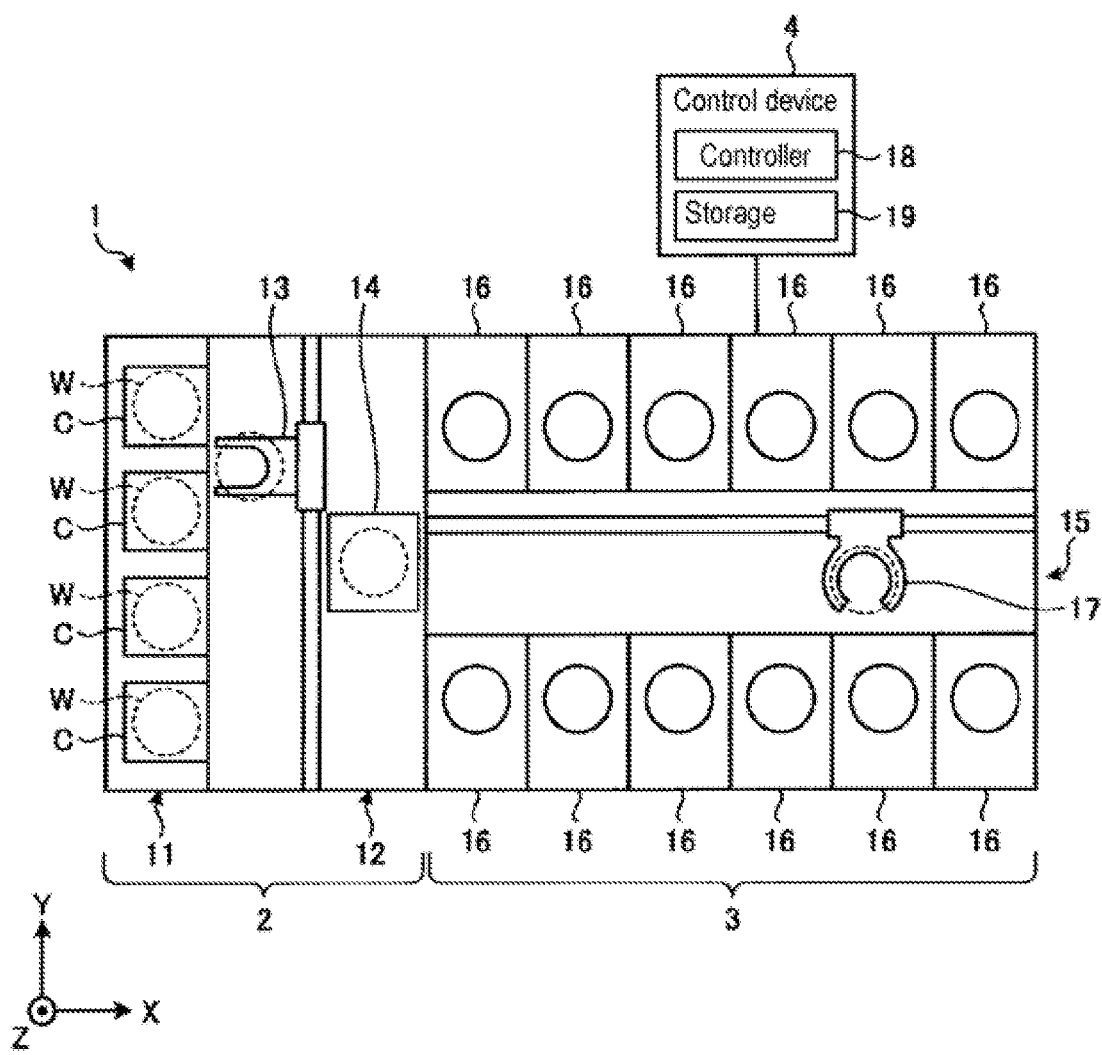
FIG. 7 is a diagram illustrating a configuration of the substrate processing apparatus according to the first embodiment.

Next, an exemplary configuration of the substrate processing apparatus 1 will be described with reference to FIG. 7. FIG. 7 is a diagram illustrating the configuration of the substrate processing apparatus 1 according to the first embodiment. In the following description, for the clarification of a positional relationship, an X-axis direction, a Y-axis direction and a Z-axis direction which are orthogonal to one another, are defined, and the Z-axis direction is defined as a vertical upward direction.

As illustrated in FIG. 7, the substrate processing apparatus 1 includes a loading/unloading station 2 and a processing station 3. The loading/unloading station 2 and the processing station 3 are provided adjacent to each other.

The loading/unloading station 2 includes a carrier stage 11 and a transfer part 12. A plurality of carriers C is mounted on the carrier stage 11. Each of the plurality of carriers C accommodates a plurality of substrates, namely the semiconductor wafers (hereinafter, referred to as wafers W) in the first embodiment, in a horizontal posture.

The transfer part 12 is provided adjacent to the carrier stage 11, and includes a substrate transfer device 13 and a delivery part 14. The substrate transfer device 13 includes a wafer holding mechanism configured to hold the wafer W. In addition, the substrate transfer device 13 is configured to be movable in horizontal and vertical directions and be swingable about a vertical axis. Thus, the wafers W is transferred between the carrier C and the delivery part 14 by the wafer holding mechanism.

The processing station 3 is provided adjacent to the transfer part 12. The processing station 3 includes a transfer part 15 and a plurality of processing units 16. The plurality of processing units 16 are provided side by side at both sides of the transfer part 15.

The transfer part 15 includes a substrate transfer device 17 provided therein. The substrate transfer device 17 includes a wafer holding mechanism configured to hold the wafer W. Furthermore, the substrate transfer device 17 is configured to be movable in the horizontal and vertical directions and be swingable about a vertical axis. Thus, the wafer W is transferred between the delivery part 14 and each of the processing units 16 by the wafer holding mechanism.

Each of the processing units 16 performs a predetermined substrate process on the wafer W transferred by the substrate transfer device 17.

In the substrate processing apparatus 1 configured as above, first, the substrate transfer device 13 of the loading/unloading station 2 picks up the wafer W from the carrier C mounted on the carrier stage 11 and mounts the picked-up wafer W on the delivery part 14. The wafer W mounted on the delivery part 14 is picked up from the delivery part 14 by the substrate transfer device 17 of the processing station 3 and is loaded into the processing unit 16.

The wafer W loaded into the processing unit 16 is processed by the processing unit 16. Thereafter, the processed wafer W is unloaded from the processing unit 16 by the substrate transfer device 17 and is mounted on the delivery part 14. Subsequently, the processed wafer W mounted on the delivery part 14 is returned to the respective carrier C of the carrier stage 11 by the substrate transfer device 13.

[Configuration of the Processing Unit]

Figure 8:
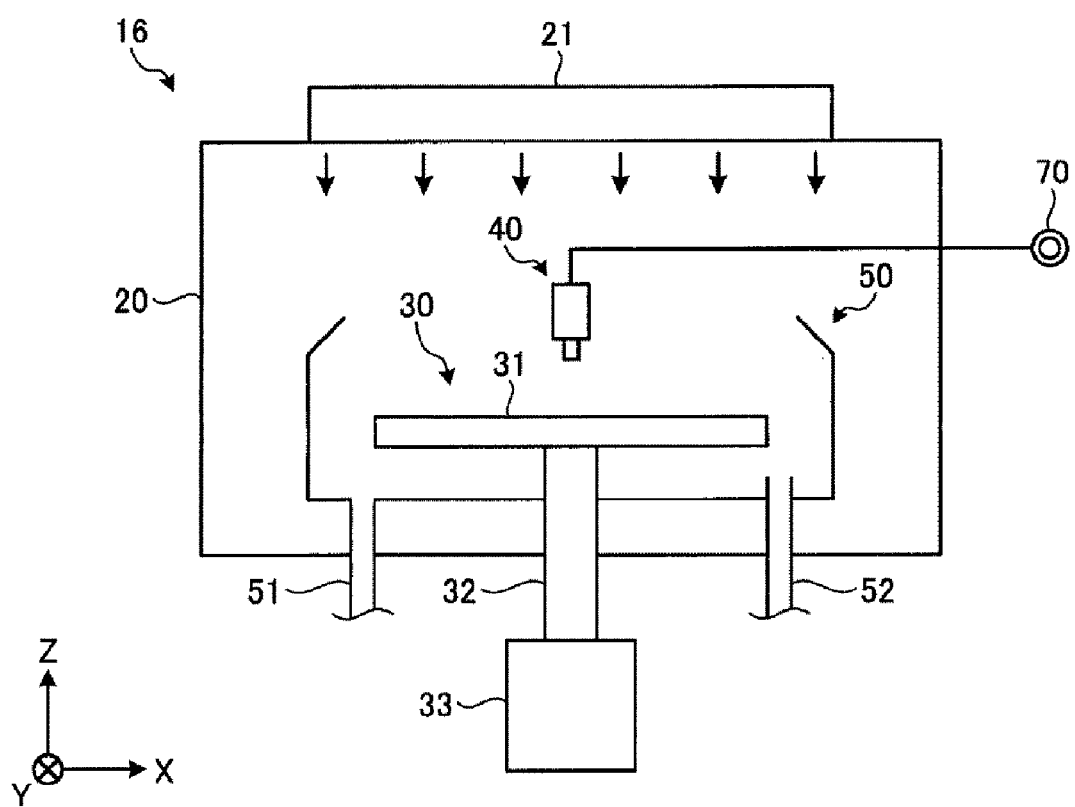
FIG. 8 is a diagram illustrating a configuration of a processing unit according to the first embodiment.

Next, a configuration of the processing unit 16 will be described with reference to FIG. 8. FIG. 8 is a diagram illustrating the configuration of the processing unit 16 according to the first embodiment.

As illustrated in FIG. 8, the processing unit 16 includes a chamber 20, a substrate holding mechanism 30, a processing fluid supply part 40, and a recovery cup 50.

The chamber 20 accommodates the substrate holding mechanism 30, the processing fluid supply part 40, and the recovery cup 50. A fan filter unit (FFU) 21 is provided in a ceiling portion of the chamber 20. The FFU 21 forms a down-flow inside the chamber 20.

The substrate holding mechanism 30 includes a holder 31, a pillar 32, and a driver 33. The holder 31 holds the wafer W in a horizontal posture. The pillar 32 is a member extending in the vertical direction. A base end portion of the pillar 32 is rotatably supported by the driver 33 and a leading end portion thereof supports the holder 31 in a horizontal posture. The driver 33 rotates the pillar 32 around a vertical axis. The substrate holding mechanism 30 rotates the holder 31 supported by the pillar 32 by rotating the pillar 32 using the driver 33, thereby rotating the wafer W supported by the holder 31.

The processing fluid supply part 40 supplies a processing fluid toward the wafer W. The processing fluid supply part 40 is connected to a processing fluid source 70.

The recovery cup 50 is arranged so as to surround the holder 31, and collects the processing fluid scattering from the wafer W with the rotation of the holder 31. A liquid drain port 51 is formed in the bottom of the recovery cup 50. The processing fluid collected by the recovery cup 50 is discharged outward of the processing unit 16 through the liquid drain port 51. In addition, an exhaust port 52 through which the gas supplied from the FFU 21 is discharged outward of the processing unit 16 is formed in the bottom of the recovery cup 50.

Figure 9:
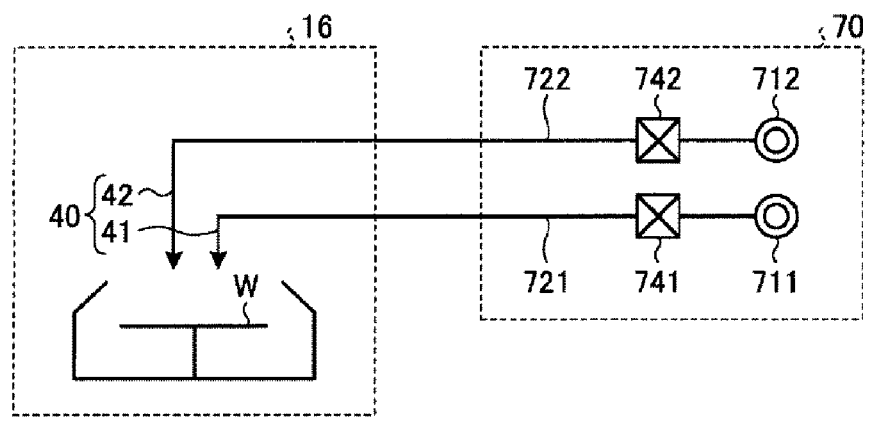
FIG. 9 is a diagram illustrating an exemplary configuration of a processing fluid supply system in the processing unit according to the first embodiment.

Next, an exemplary configuration of a processing fluid supply system in the processing unit 16 will be described with reference to FIG. 9. FIG. 9 is a diagram illustrating the exemplary configuration of the processing fluid supply system in the processing unit 16 according to the first embodiment.

For example, as illustrated in FIG. 9, the processing unit 16 includes a removal solution supply part 41 and a DIW supply part 42, which constitute the processing fluid supply part 40. The removal solution supply part 41 supplies a removal solution toward the wafer W. Furthermore, the DIW supply part 42 supplies a deionized water (DIW) as a rinse solution toward the wafer W.

The processing fluid source 70 includes a removal solution source 711, a removal solution supply passage 721, and a valve 741, which constitute a removal solution supply system.

The removal solution source 711 is a source of the removal solution. For example, when the removal solution is ozone water, the removal solution source 711 may be configured to include a DIW source and an ozone water generator. In this case, the removal solution source 711 can generate the ozone water by dissolving ozone in DIW supplied from the DIW source using the ozone water generator. Furthermore, the removal solution source 711 generates the ozone water of, e.g., 70 to 150 ppm.

The removal solution supply passage 721 is a pipe that connects the removal solution source 711 and the removal solution supply part 41. The valve 741 is provided in the removal solution supply passage 721 to open and close the removal solution supply passage 721.

Furthermore, when the removal solution is a hydrogen peroxide solution, the processing fluid source 70 may be configured to include a hydrogen peroxide solution source as the removal solution source 711. The hydrogen peroxide solution source supplies the hydrogen peroxide solution having a hydrogen peroxide concentration ranging from 16.5 wt % to 35 wt %. In this case, the hydrogen peroxide solution source may include a mixing part that mixes an undiluted solution of the hydrogen peroxide and DIW. In some embodiments, the processing fluid source 70 may produce the hydrogen peroxide solution having the aforementioned concentration range on the wafer W by supplying the undiluted solution of the hydrogen peroxide and the DIW onto the wafer W.

In addition, when the removal solution is a mixed solution, the processing fluid source 70 may be, for example, a tank that stores a mixed solution of a sulfuric acid, a nitric acid, and water.

Figure 10:
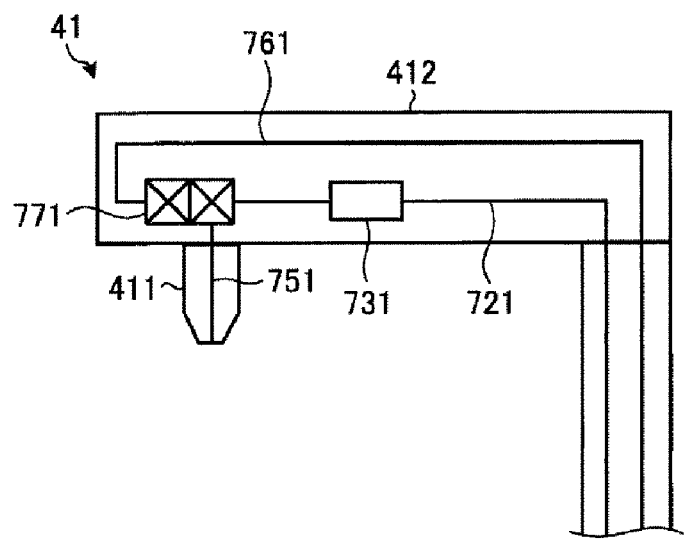
FIG. 10 is a diagram illustrating an exemplary configuration of a removal solution supply part.

An exemplary configuration of the removal solution supply part 41 will be described with reference to FIG. 10. FIG. 10 is a diagram illustrating the exemplary configuration of the removal solution supply part 41.

As illustrated in FIG. 10, the removal solution supply part 41 includes a nozzle 411 configured to discharge the removal solution, and a nozzle arm 412 configured to support the nozzle 411 and including a removal solution supply passage 721 formed therein.

The removal solution supply part 41 includes a heating part 731 configured to heat the removal solution flowing through the removal solution supply passage 721. The heating part 731 is provided inside the nozzle arm 412. The heating part 731 is, for example, a nozzle heater, and heats the removal solution supply passage 721 using a heating element disposed around the removal solution supply passage 721, thus heating the removal solution flowing through the removal solution supply passage 721.

In addition, the removal solution supply part 41 includes a removal solution discharge passage 751, a removal solution return passage 761, and a switching valve 771. The removal solution discharge passage 751 is a passage that guides the removal solution flowing through the removal solution supply passage 721 to a leading end of the nozzle 411. The removal solution return passage 761 is a passage that guides the removal solution flowing through the removal solution supply passage 721 to a discharge passage provided outside the removal solution supply part 41. The switching valve 771 is a valve that switches a destination of the removal solution flowing through the removal solution supply passage 721 between the removal solution discharge passage 751 and the removal solution return passage 761.

The removal solution supply part 41 heats the removal solution and supplies the same toward the wafer W under the control of the controller 18. Specifically, after the valve 741 is brought from a closed state into an open state, the removal solution supply part 41 allows the removal solution to flow through the removal solution return passage 761 for a preset period of time. The preset period of time is a time period taken until a temperature of the removal solution flowing through the removal solution supply passage 721 reaches a predetermined temperature. After the preset period of time elapses, the removal solution supply part 41 drives the switching valve 771 to switch the destination of the removal solution to the removal solution discharge passage 751. This makes it possible to discharge the removal solution heated to the predetermined temperature toward the wafer W.

The removal solution supply part 41 can increase the etching rate of the boron-based film 112 by heating the removal solution using the heating part 731 in this way. Furthermore, by installing the heating part 731 inside the nozzle arm 412, for example, when the removal solution is the ozone water, the ozone water can be heated immediately before being discharged toward the wafer W. Thus, it is possible to suppress the hydroxy radicals from being deactivated before reaching the boron-based film 112 on the wafer W.

In addition, in a case where the removal solution is a hydrogen peroxide solution or a mixed solution, the heating part 731 may not be provided inside the nozzle arm 412. In some embodiments, the heating part 731 may be provided in the removal solution supply passage 721 at the upstream side of the nozzle arm 412.

The processing fluid source 70 includes a DIW source 712, a DIW supply passage 722, and a valve 742, which constitute a DIW supply system. When the valve 742 is brought from a closed state into an open state, DIW is supplied from the DIW source 712 to the DIW supply part 42 via the DIW supply passage 722. Subsequently, the DIW is supplied from the DIW supply part 42 toward the wafer W.

In some embodiments, when ozone is used as the removal solution, the processing unit 16 may have a configuration in which the ozone water supplied to the wafer W is discharged while being diluted with water. In some embodiments, the processing unit 16 may include an ozone killer that decomposes ozone in an ozone water discharge passage.

[Specific Operation of the Substrate Processing System]

Figure 11:
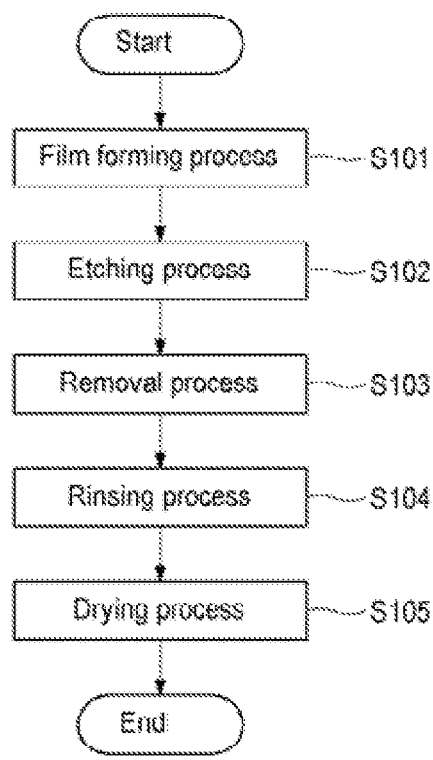
FIG. 11 is a flowchart illustrating an example of a substrate processing procedure performed by the substrate processing system according to the first embodiment.

Next, an example of a specific operation of the substrate processing system 100 will be described with reference to FIG. 11. FIG. 11 is a flowchart illustrating an example of a substrate processing procedure performed by the substrate processing system 100 according to the first embodiment. The processing procedure illustrated in FIG. 11 is performed under the control of the controllers 18, 401, and 501.

As illustrated in FIG. 11, in the substrate processing system 100, first, the wafer W having the silicon oxide film 111 is loaded into the film-forming processing unit 201 of the film forming apparatus 200. Thereafter, in the film-forming processing unit 201, the film forming process of forming the boron-based film 112 on the silicon oxide film 111 (in step S101) is performed.

Specifically, first, the interior of the processing container 220 is controlled to have a predetermined temperature, for example, 200 to 500 degrees C., and the wafer boat 230 in which the plurality of wafers W are accommodated is inserted into the processing container 220 kept in an atmospheric pressure state. At this state, the interior of the processing container 220 is evacuated so that the interior is kept in a vacuum state. Subsequently, the internal pressure of the processing container 220 is adjusted to a predetermined low pressure, for example, 133.3 Pa (1.0 Torr) to stabilize the temperature of the wafer W. In this state, the boron-containing gas such as a $B_2H_6$ gas is introduced into the processing container 220 by the boron-containing gas supply mechanism 240. The boron-based film 112 is formed on the front surface of the wafer W by pyrolizing the boron-containing gas on the front surface of the wafer W by CVD. Thereafter, the inert gas is supplied from the inert gas supply mechanism 250 into the processing container 220 to purge the interior of the processing container 220. Subsequently, the interior of the processing container 220 is evacuated by the vacuum pump 263. Thereafter, the interior of the processing container 220 is kept in an atmospheric pressure, and the film forming process is completed. Thus, the boron-based film 112 is formed on the silicon oxide film 111 of the wafer W (see FIG. 1A).

The wafer W subjected to the film forming process is unloaded from the film forming apparatus 200 and then loaded into the etching processing unit 301 of the etching apparatus 300. In the etching processing unit 301, the etching process of etching the silicon oxide film 111 of the wafer W using the boron-based film 112 as a hard mask (in step S102) is performed.

Specifically, the interior of the chamber 310 is depressurized by the exhaust device 390. Thereafter, the wafer W mounted on the stage 320 is dry-etched by supplying an etching gas from the shower head 340 into the chamber 310. Thus, the recess 113 is formed in the wafer W (see FIG. 1B).

The wafer W subjected to the etching process is unloaded from the etching apparatus 300 and then loaded into the processing unit 16 of the substrate processing apparatus 1. The wafer W loaded into the processing unit 16 is held in a horizontal posture by the holder 31 in a state where an upper surface of the boron-based film 112 formed on the silicon oxide film 111 is oriented upward. Thereafter, in the processing unit 16, the removal process of removing the boron-based film 112 from the wafer W (in step S103) is performed.

Specifically, in the removal process, the removal solution supply part 41 of the processing fluid supply part 40 is located above the center of the wafer W. Thereafter, the valve 741 is opened for a predetermined period of time to supply the removal solution from the removal solution supply part 41 toward the wafer W (see FIG. 1C). Furthermore, as described above, the removal solution to be supplied toward the wafer W has been heated by the heating part 731.

The removal solution supplied to the wafer W spreads on the front surface of the wafer W by virtue of a centrifugal force accompanied by the rotation of the wafer W by the driver 33 (see FIG. 8). Thus, first, the removal solution is brought into contact with the boron-based film 112 to produce $B(OH)_3$ or $B_2O_3$. Subsequently, the produced $B(OH)_3$ or $B_2O_3$ is dissolved in water contained in the removal solution so that the boron-based film 112 is removed from the wafer W (see FIG. 1D).

Subsequently, in the processing unit 16, a rinsing process of rinsing the front surface of the wafer W with DIW (in step S104) is performed. In this rinsing process, the DIW supply part 42 is located above the center of the wafer W. Thereafter, the valve 742 is opened for a predetermined period of time to supply DIW from the DIW supply part 42 toward the front surface of the rotating wafer W, so that the boron-based film 112 removed from the wafer W and the removal solution remaining on the wafer W are washed away by DIW.

Subsequently, in the processing unit 16, a drying process of shaking off DIW remaining on the front surface of the wafer W while increasing a rotational speed of the wafer W for a predetermined period of time to dry the wafer W (in step S105) is performed. Thereafter, the rotation of the wafer W is stopped.

The dried wafer W is unloaded from the processing unit 16 by the substrate transfer device 17 and accommodated in the respective carrier C mounted on the carrier stage 11 via a sequence of the delivery part 14 and the substrate transfer device 13. Thus, a series of substrate processes for one sheet of wafer W are completed.

Second Embodiment

Figure 12:
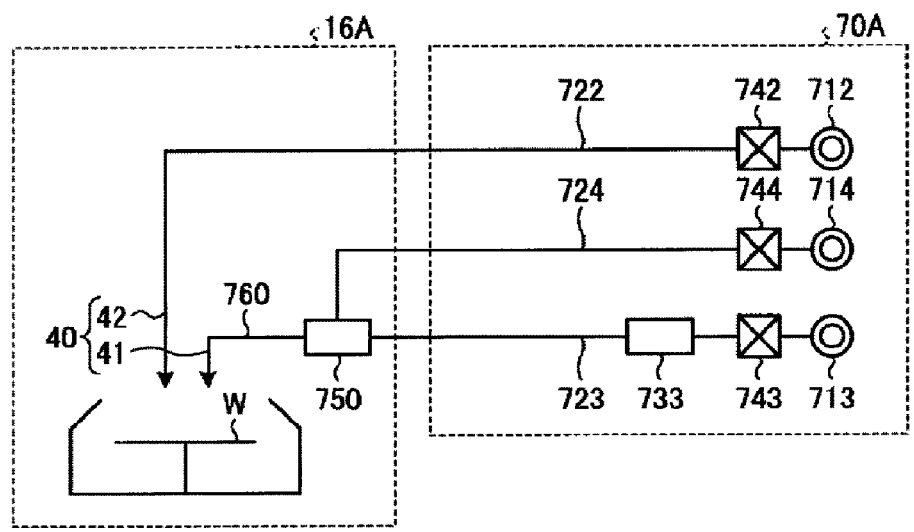
FIG. 12 is a diagram illustrating an exemplary configuration of a processing fluid supply system in a processing unit according to a second embodiment of the present disclosure.

Next, a second embodiment of the present disclosure will be described. In this second embodiment, another exemplary configuration of a processing fluid supply system in a case where the removal solution is a mixed solution of a nitric acid, a sulfuric acid and water, will be described with reference to FIG. 12. FIG. 12 is a diagram illustrating an example of the configuration of the processing fluid supply system in a processing unit according to the second embodiment.

As illustrated in FIG. 12, a processing fluid source 70A according to the second embodiment includes a sulfuric acid source 713, a sulfuric acid supply passage 723, a heating part 733, and a valve 743, which constitute a sulfuric acid supply system.

The sulfuric acid source 713 is a tank that stores a sulfuric acid diluted in a predetermined concentration with water (DIW). For example, a sulfuric acid diluted in a concentration of 50% is stored in the sulfuric acid source 713.

The sulfuric acid supply passage 723 is a pipe that connects the sulfuric acid source 713 and a mixer 750 to be described later. The heating part 733 is provided in the sulfuric acid supply passage 723 and heats the sulfuric acid flowing through the sulfuric acid supply passage 723. The heating part 733 is, for example, a heater. The valve 743 is provided in the sulfuric acid supply passage 723 and opens and closes the sulfuric acid supply passage 723.

In addition, the processing fluid source 70A includes a nitric acid source 714, a nitric acid supply passage 724, and a valve 744, which constitute a nitric acid supply system.

The nitric acid source 714 is a tank that stores nitric acid diluted in a predetermined concentration with water (DIW). For example, a nitric acid diluted in a concentration of 69% is stored in the nitric acid source 714.

The nitric acid supply passage 724 is a pipe that connects the nitric acid source 714 and the mixer 750 to be described later. The valve 744 opens and closes the nitric acid supply passage 724.

In addition, the processing fluid source 70A includes the DIW source 712, the DIW supply passage 722, and the valve 742, which constitute the DIW supply system.

The processing unit 16A includes the mixer 750 and a removal solution supply passage 760. The mixer 750 mixes the sulfuric acid supplied through the sulfuric acid supply passage 723 at a predetermined flow velocity and the nitric acid supplied through the nitric acid supply passage 724 at a predetermined flow velocity, while maintaining the respective flow velocities, at a preset mixing ratio, thus producing a removal solution which is a mixed solution. For example, the mixer 750 mixes the sulfuric acid and the nitric acid at a ratio of:

Sulfuric acid of 50% concentration:Nitric acid of 69% concentration=10:1

The mixer 750 is disposed inside the chamber 20 (see FIG. 8) of the processing unit 16A. For example, the mixer 750 may be provided inside the nozzle arm 412 (see FIG. 10).

The removal solution supply passage 760 connects the mixer 750 and the removal solution supply part 41, and supplies the removal solution produced in the mixer 750 to the removal solution supply part 41.

Next, a removal process according to the second embodiment will be described. In the removal process according to the second embodiment, after the etched wafer W is held by the holder 31, the removal solution supply part 41 of the processing fluid supply part 40 is located above the center of the wafer W.

Thereafter, the valve 743 and the valve 744 are opened for a predetermined period of time. The water-diluted sulfuric acid heated by the heating part 733 and the water-diluted nitric acid flow into the mixer 750 so that the removal solution is produced.

Thereafter, the removal solution produced in the mixer 750 is supplied from the removal solution supply part 41 toward the wafer W. The removal solution supplied to the wafer W spreads on the front surface of the wafer W by virtue of a centrifugal force accompanying the rotation of the wafer W by the driver 33. Thus, the boron-based film 112 is removed from the wafer W.

As described above, the processing unit 16A according to the second embodiment includes the processing fluid supply part 40 and the processing fluid source 70A. Specifically, the processing unit 16A includes the sulfuric acid supply passage 723, the nitric acid supply passage 724, the mixer 750, and the removal solution supply part 41. The sulfuric acid supply passage 723 flows therethrough the sulfuric acid diluted with water, which is supplied from the sulfuric acid source 713. The nitric acid supply passage 724 flow therethrough the nitric acid diluted with water, which is supplied from the nitric acid source 714. The mixer 750 mixes the water-diluted sulfuric acid flowing through the sulfuric acid supply passage 723 and the water-diluted nitric acid flowing through the nitric acid supply passage 724, while maintaining the respective flow velocities, prior to supplying the removal solution toward the wafer W. The removal solution supply part 41 supplies the removal solution produced by the mixer 750 toward the wafer W.

According to the processing unit 16A configured as above, the produced removal solution immediately reaches the wafer W because it also has a flow velocity corresponding to those of the water-diluted sulfuric acid and the water-diluted nitric acid. This makes it possible to supply, toward the wafer W, more fresh removal solution, namely before the capability of removing the boron-based film 112 is reduced, for example, compared with a case where a previously-prepared removal solution is stored in a tank. Thus, according to the processing unit 16A of the second embodiment, the boron-based film 112 can be more appropriately removed.

In some embodiments, the heating part 733 may be omitted in the processing unit 16A as long as a removal solution can be heated with heat generated by a reaction between the sulfuric acid and the nitric acid and can be supplied to the wafer W. In this case, for example, a change in temperature of the removal solution, which is caused by the reaction heat available when mixing the sulfuric acid and the nitric acid, is measured in advance by experiment or the like. In some embodiments, a length of the removal solution supply passage 760 may be optimized so that the removal solution is in contact with the wafer W when the temperature of the removal solution falls within a predetermined range including a maximum value.

In some embodiments, the processing unit 16A may be configured to produce a removal solution having a concentration higher than a desired concentration in the mixer 750 and supply the same from the removal solution supply part 41 toward the wafer W. In this case, the processing unit 16A may be configured to produce a removal solution having a desired concentration on the wafer W by supplying DIW from the DIW supply part 42 toward the wafer W and diluting the removal solution of a high concentration with DIW on the wafer W.

Third Embodiment

Next, a third embodiment of the present disclosure will be described. In this third embodiment, another exemplary configuration of a processing fluid supply system when the removal solution is a mixed solution of a nitric acid, a sulfuric acid, and water will be described with reference to FIG. 13.

Figure 13:
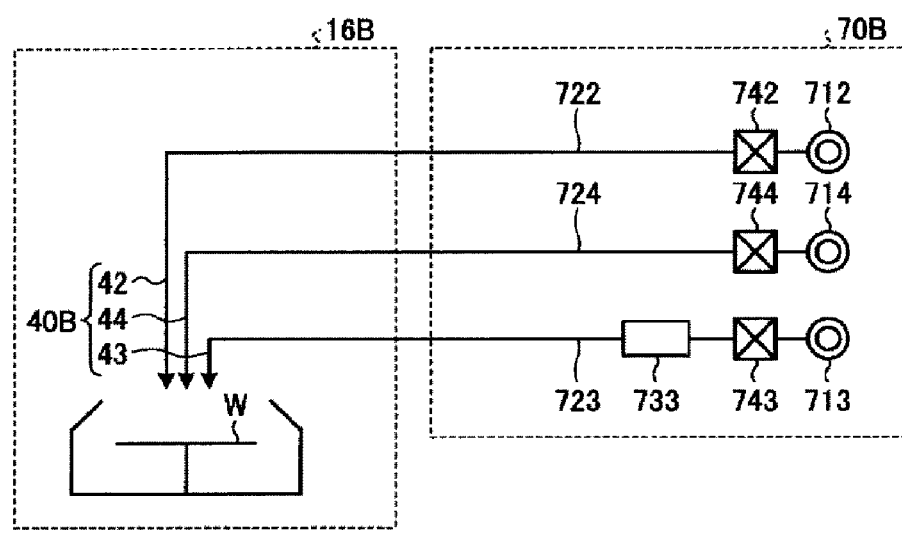
FIG. 13 is a diagram illustrating an exemplary configuration of a processing fluid supply system in a processing unit according to a third embodiment of the present disclosure.

FIG. 13 is a diagram illustrating an exemplary configuration of a processing fluid supply system in a processing unit according to the third embodiment. As illustrated in FIG. 13, a processing unit 16B according to the third embodiment includes the DIW supply part 42, a sulfuric acid supply nozzle 43, and a nitric acid supply nozzle 44, which constitute a processing fluid supply part 40B.

The sulfuric acid supply nozzle 43 is a nozzle that supplies a sulfuric acid toward the wafer W. The nitric acid supply nozzle 44 is a nozzle that supplies a nitric acid toward the wafer W.

A processing fluid source 70B includes the sulfuric acid source 713, the sulfuric acid supply passage 723, the heating part 733, and the valve 743, which constitute the sulfuric acid supply system. The sulfuric acid supply passage 723 is connected to the sulfuric acid supply nozzle 43.

In addition, the processing fluid source 70B includes the nitric acid source 714, the nitric acid supply passage 724, and the valve 744, which constitute the nitric acid supply system. The nitric acid supply passage 724 is connected to the nitric acid supply nozzle 44.

Furthermore, the processing fluid source 70B includes the DIW source 712, the DIW supply passage 722, and the valve 742, which constitute the DIW supply system. The DIW supply passage 722 is connected to the DIW supply part 42.

Next, a removal process according to the third embodiment will be described. In the removal process according to the third embodiment, the etched wafer W is held by the holder 31, and subsequently, the sulfuric acid supply nozzle 43 and the nitric acid supply nozzle 44 of the processing fluid supply part 40B are located above the wafer W. Thereafter, the valve 743 and the valve 744 are opened for a predetermined period of time. The water-diluted sulfuric acid heated by the heating part 733 and the water-diluted nitric acid are respectively supplied from the sulfuric acid supply nozzle 43 and the nitric acid supply nozzle 44 toward the wafer W. Flow rates of the sulfuric acid and the nitric acid are adjusted by the valve 743 and the valve 744 so as to have a predetermined flow rate ratio with respect to each other. For example, the flow rate ratio of the sulfuric acid and the nitric acid may be adjusted to 10:1.

The sulfuric acid and the nitric acid supplied to the wafer W are mixed with each other on the wafer W to produce a removal solution on the wafer W. The produced removal solution spreads on the front surface of the wafer W by virtue of a centrifugal force accompanying the rotation of the wafer W by the driver 33. Thus, the boron-based film 112 is removed from the wafer W.

As described above, the processing unit 16B according to the third embodiment includes the processing fluid supply part 40B and the processing fluid source 70B. Specifically, the processing unit 16B includes the sulfuric acid supply passage 723, the nitric acid supply passage 724, the sulfuric acid supply nozzle 43, and the nitric acid supply nozzle 44. The sulfuric acid supply passage 723 flows therethrough the water-diluted sulfuric acid supplied from the sulfuric acid source 713. The nitric acid supply passage 724 flows therethrough the water-diluted nitric acid supplied from the nitric acid source 714. The sulfuric acid supply nozzle 43 supplies the water-diluted sulfuric acid flowing through the sulfuric acid supply passage 723 toward the wafer W. The nitric acid supply nozzle 44 supplies the water-diluted nitric acid flowing through the nitric acid supply passage 724 toward the wafer W. In the removal process according to the third embodiment, the water-diluted sulfuric acid and the water-diluted nitric acid are supplied to the wafer W held by the holder 31 to produce the removal solution on the wafer W, thus removing the boron-based film 112.

According to the processing unit 16B, it is possible to supply a relatively fresh removal solution, which has just been produced, to the wafer W, with a more simplified configuration than the configuration in which the mixer 750 is provided.

Fourth Embodiment

Figure 14A:
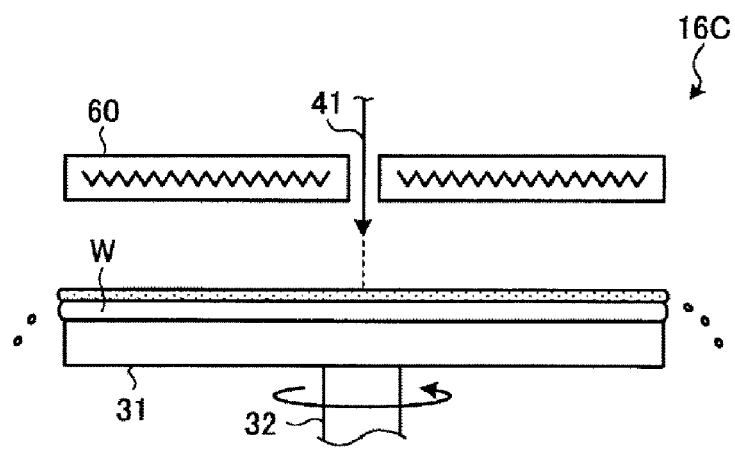
FIG. 14A is a view illustrating an exemplary configuration of a processing unit according to a fourth embodiment of the present disclosure.
Figure 14B:
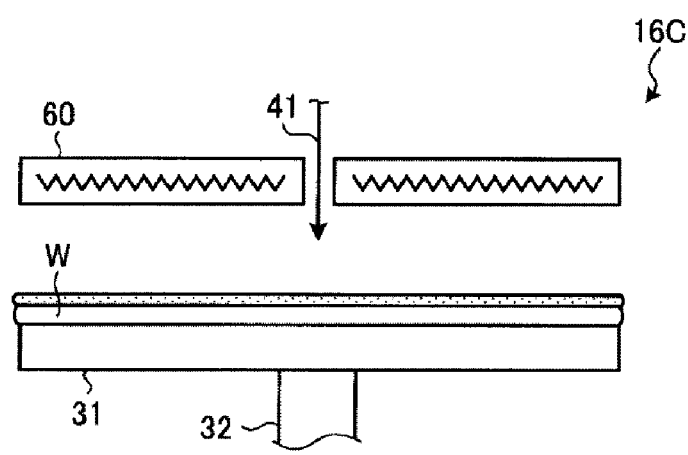
FIG. 14B is a view illustrating an exemplary configuration of the processing unit according to the fourth embodiment.

Next, a fourth embodiment of the present disclosure will be described. FIGS. 14A and 14B are views illustrating an exemplary configuration of a processing unit 16C according to the fourth embodiment.

As illustrated in FIG. 14A, the processing unit 16C according to the fourth embodiment includes a heater 60. An example of the heater 60 may include a resistance heater, a lamp heater or the like, and is disposed separately from the holder 31 above the holder 31. The heater 60 may be provided integrally with the holder 31. For example, the heater 60 may be incorporated in the holder 31.

Next, a removal process according to the fourth embodiment will be described. In the removal process according to the fourth embodiment, a liquid film of the removal solution is formed on the front surface of the etched wafer W held by the holder 31 (in a liquid film forming process).

For example, as illustrated in FIG. 14A, the removal solution is supplied from the removal solution supply part 41 toward the wafer W. The liquid film of the removal solution is formed on the wafer W by rotating the wafer W by the driver 33 (see FIG. 8).

Subsequently, as illustrated in FIG. 14B, after the liquid film forming process, the state in which the liquid film of the removal solution is formed on the wafer W is maintained for a predetermined period of time (in a maintenance process). Specifically, the rotation of the wafer W is stopped and the supply of the removal solution from the removal solution supply part 41 toward the wafer W is stopped such that the respective removal solution stays on the wafer W for a predetermined period of time. In the maintenance process, the processing unit 16C heats the removal solution on the wafer W using the heater 60 to maintain the removal solution on the wafer W at a constant temperature. Thus, it is possible to suppress the removal performance from degrading due to lowering of the temperature.

In this manner, the processing unit 16C according to the fourth embodiment may perform the liquid film forming process of forming the liquid film of the removal solution on the wafer W held by the holder 31, followed by the maintenance process of maintaining the state in which the liquid film of the removal solution is formed on the wafer W for a predetermined period of time. That is to say, the processing unit 16C may stay the respective ozone water as the removal solution on the wafer W for a predetermined period of time. Thus, it is possible to reduce an amount of the ozone water used as the removal solution.

The configuration of the fourth embodiment is particularly effective when the removal solution is a mixed solution. That is to say, it is possible to enhance the removal efficiency of the boron-based film 112 by staying the respective mixed solution on the wafer W for a predetermined period of time, for example, compared with the case where the rotation of the wafer W and the supply of the mixed solution from the removal solution supply part 41 toward the wafer W are continued. This is presumably because a reaction product obtained from boron and the mixed solution serves as an etchant to promote the removal of the boron-based film 112.

Fifth Embodiment

Figure 15:
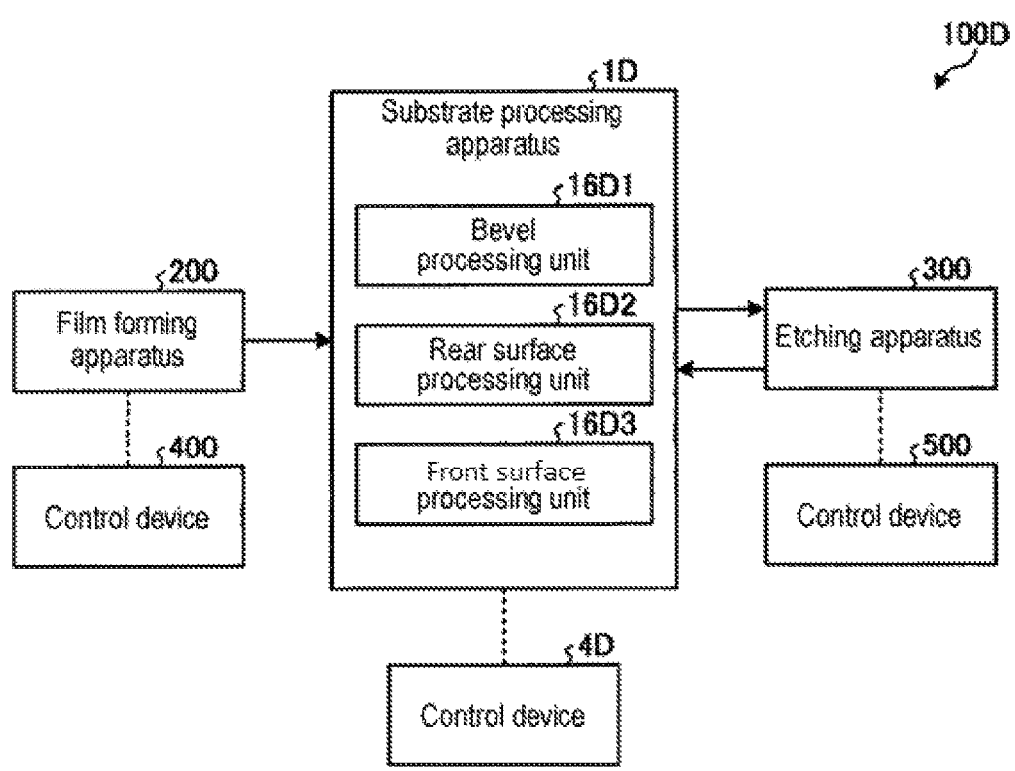
FIG. 15 is a diagram illustrating an exemplary configuration of a substrate processing system according to a fifth embodiment of the present disclosure.

Next, a fifth embodiment of the present disclosure will be described. FIG. 15 is a diagram illustrating an exemplary configuration of a substrate processing system according to the fifth embodiment.

As illustrated in FIG. 15, a substrate processing system 100D according to the fifth embodiment includes the film forming apparatus 200, the etching apparatus 300, and a substrate processing apparatus 1D.

In the substrate processing system 100D, after the film forming process and before the etching process, a pre-removal process of bringing the removal solution into contact with a rear surface and a beveled portion of the wafer W to remove the boron-based film 112 from the rear surface and the beveled portion of the wafer W is performed.

The substrate processing apparatus 1D includes a beveled portion processing unit 16D1, a rear surface processing unit 16D2, and a front surface processing unit 16D3. Furthermore, the substrate processing apparatus 1D is connected to a control device 4D. Operations of the beveled portion processing unit 16D1, the rear surface processing unit 16D2 and the front surface processing unit 16D3 are controlled by the control device 4D.

Figure 16:
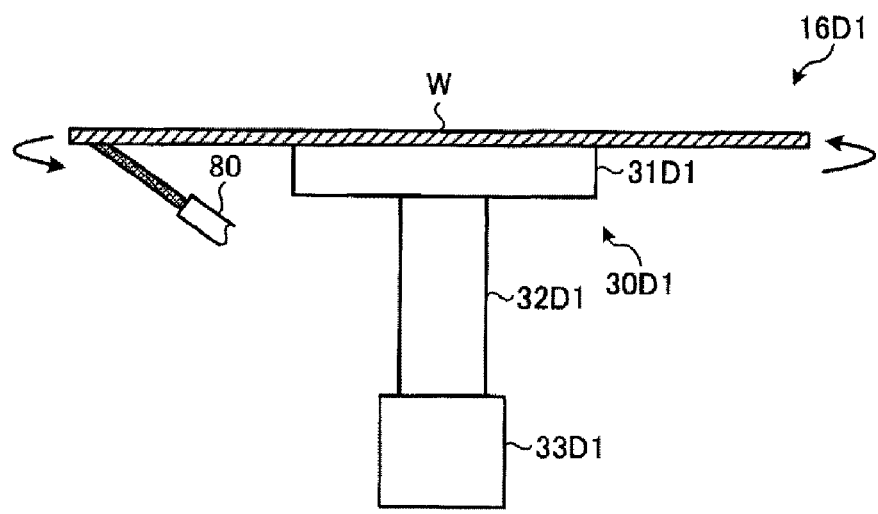
FIG. 16 is a diagram illustrating an exemplary configuration of a beveled portion processing unit.

The beveled portion processing unit 16D1 removes the boron-based film 112 formed on the beveled portion of the wafer W with the removal solution. An exemplary configuration of the beveled portion processing unit 16D1 will be described with reference to FIG. 16. FIG. 16 is a diagram illustrating an example of the configuration of the beveled portion processing unit 16D1.

As illustrated in FIG. 16, the beveled portion processing unit 16D1 includes a substrate holding mechanism 30D1 and a bevel supply part 80.

The substrate holding mechanism 30D1 includes a holder 31D1 for adsorptively holding the wafer W, a pillar 32D1 for supporting the holder 31D1, and a driver 33D1 for rotating the pillar 32D1. The holder 31D1 is connected to an intake device such as a vacuum pump. The holder 31D1 holds the wafer W in a horizontal posture by adsorbing the rear surface of the wafer W using a negative pressure generated by intake of the intake device. For example, a porous chuck may be used as the holder 31D1.

The bevel supply part 80 is provided at, for example, a bottom portion of a recovery cup (not shown), and supplies the removal solution toward a peripheral portion of the rear surface of the wafer W.

The beveled portion processing unit 16D1 configured as above holds the wafer W using the holder 31D1, and supplies the removal solution from the bevel supply part 80 toward the peripheral portion of the rear surface of the wafer W while rotating the wafer W by the driver 33D1. The removal solution supplied to the peripheral portion of the rear surface of the wafer W flows around the beveled portion of the wafer W to remove the boron-based film 112 formed on the beveled portion. Thereafter, the rotation of the wafer W is stopped.

In addition, the bevel supply part 80 is connected to a DIW source (not shown). After removing the boron-based film 112 from the beveled portion of the wafer W, the bevel supply part 80 performs a rinsing process of suppling DIW toward the peripheral portion of the rear surface of the wafer W to wash away the boron-based film 112 and the removal solution remaining on the beveled portion.

Figure 17:
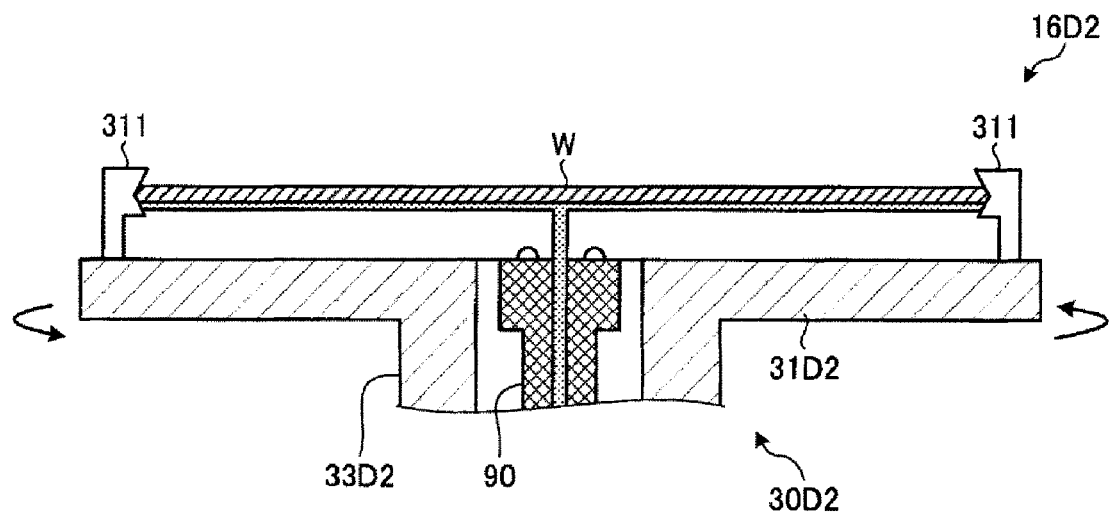
FIG. 17 is a view illustrating an exemplary configuration of a rear surface processing unit.

The rear surface processing unit 16D2 removes the boron-based film 112 formed on the rear surface of the wafer W with the removal solution. An exemplary configuration of the rear surface processing unit 16D2 will be described with reference to FIG. 17. FIG. 17 is a diagram illustrating an example of the configuration of the rear surface processing unit 16D2.

As illustrated in FIG. 17, the rear surface processing unit 16D2 includes a substrate holding mechanism 30D2 that rotatably holds the wafer W, and a rear surface supply part 90 that is inserted into a hollow portion of the substrate holding mechanism 30D2 to supply the removal solution to the rear surface of the wafer W.

A plurality of grippers 311 for gripping the peripheral portion of the wafer W is provided on an upper surface of the substrate holding mechanism 30D2. The wafer W is held in a horizontal posture while being slightly separated from the upper surface of the substrate holding mechanism 30D2 by the plurality of grippers 311.

Furthermore, the substrate holding mechanism 30D2 includes a driver 33D2, and is rotated about the vertical axis by the driver 33D2. Thereafter, as the substrate holding mechanism 30D2 rotates, the wafer W held by the substrate holding mechanism 30D2 rotates in an integral relationship with the substrate holding mechanism 30D2.

The rear surface supply part 90 is inserted into the hollow portion of the substrate holding mechanism 30D2 and supplies the removal solution to the central portion of the rear surface of the wafer W.

The rear surface processing unit 16D2 configured as above holds the wafer W using the plurality of grippers 311 of the substrate holding mechanism 30D2, and supplies the removal solution from the rear surface supply part 90 to the central portion of the rear surface of the wafer W while rotating the wafer W by the driver 33D2. The removal solution supplied to the central portion of the rear surface of the wafer W spreads on the rear surface of the wafer W by virtue of a centrifugal force accompanied by the rotation of the wafer W, thereby removing the boron-based film 112 formed on the rear surface. Thereafter, the rotation of the wafer W is stopped.

Furthermore, the rear surface supply part 90 is connected to a DIW source (not shown). After removing the boron-based film 112 from the rear surface of the wafer W, the rear surface supply part 90 performs a rinsing process of supplying DIW to the center portion of the rear surface of the wafer W to wash away the boron-based film 112 and the removal solution remaining on the rear surface.

The front surface processing unit 16D3 removes the boron-based film 112 formed on the front surface of the wafer W. Any one of the processing units 16, and 16A to 16C may be applied as the front surface processing unit 16D3.

Next, a substrate processing procedure according to the fifth embodiment will be described. In the substrate processing system 100D according to the fifth embodiment, after the film forming process is performed by the film forming apparatus 200, the wafer W subjected to the film forming process is loaded into the beveled portion processing unit 16D1 of the substrate processing apparatus 1D. Thereafter, a beveled portion removal process of removing the boron-based film 112 formed on the beveled portion of the wafer W is performed in the beveled portion processing unit 16D1.

Subsequently, the wafer W subjected to the beveled portion removal process is subjected to the rinsing process and the drying process in the beveled portion processing unit 16D1, and subsequently, is loaded into the rear surface processing unit 16D2. Thereafter, the wafer W subjected to the beveled portion removal process is subjected to a rear surface removal process of removing the boron-based film 112 formed on the rear surface of the wafer W in the rear surface processing unit 16D2.

Subsequently, the wafer W subjected to the rear surface removal process is subjected to the rinsing process and the drying process in the rear surface processing unit 16D2, and subsequently, is unloaded from the substrate processing apparatus 1D, followed by loaded into the etching apparatus 300 where the etching process is performed.

Subsequently, the wafer W subjected to the etching process is loaded into the front surface processing unit 16D3 of the substrate processing apparatus 1D where the removal process, the rinsing process, and the drying process as described above are performed.

In this manner, the substrate processing system 100D according to the fifth embodiment performs the pre-removal process of bringing the removal solution into contact with the rear surface and the beveled portion of the wafer W to remove the boron-based film 112 from the rear surface and the beveled portion of the wafer W, after the film forming process and before the etching process. Thus, the boron-based film 112 formed on the rear surface and the beveled portion unnecessary for the etching process can be removed before the etching process.

While in the above, the rear surface removal process has been described to be performed after the beveled portion removal process, the beveled portion removal process may be performed after the rear surface removal process. In some embodiments, the bevel supply part 80 and the rear surface supply part 90 may be provided in a single processing unit so that the beveled portion removal process and the rear surface removal process are simultaneously performed.

In the above embodiment, there has been described the example in which all of the bevel supply part 80, the rear surface supply part 90, and the processing fluid supply part 40 are provided in the single substrate processing apparatus 1D. However, the present disclosure is not limited thereto. The substrate processing system 100D may be configured to include a first substrate processing apparatus equipped with the bevel supply part 80 and the rear surface supply part 90, and a second substrate processing apparatus equipped with the processing fluid supply part 40.

Sixth Embodiment

Figure 18A:
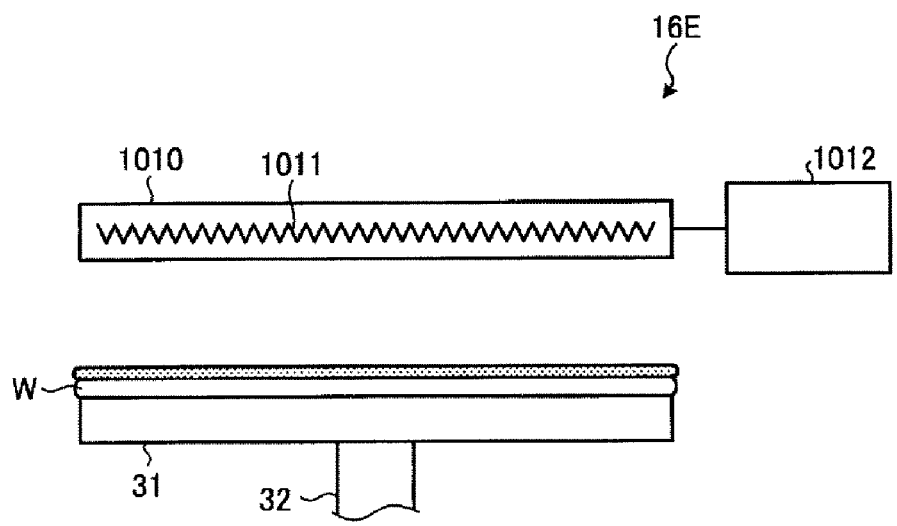
FIG. 18A is a view illustrating an exemplary configuration of a processing unit according to a sixth embodiment of the present disclosure.
Figure 18B:
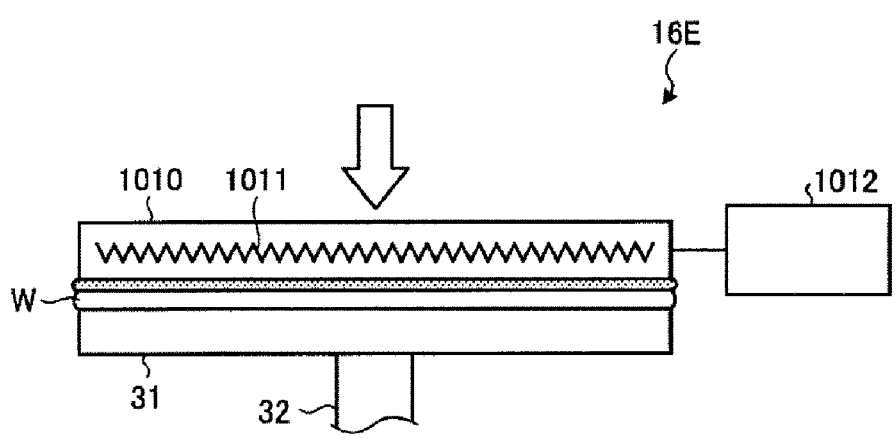
FIG. 18B is a view illustrating an exemplary configuration of the processing unit according to the sixth embodiment.

Next, a sixth embodiment of the present disclosure will be described. FIGS. 18A and 18B are diagrams illustrating an exemplary configuration of a processing unit according to the sixth embodiment.

As illustrated in FIG. 18A, a processing unit 16E according to the sixth embodiment includes a lid 1010. The lid 1010 is disposed above the holder 31. The lid 1010 is disposed to face the wafer W held by the holder 31. The facing surface of the lid 1010 is a plane having a diameter equal to or larger than that of the wafer W.

A heating part 1011 such as a heater is embedded in the lid 1010. In some embodiments, the heating part 1011 may be embedded in the holder 31 or in both the lid 1010 and the holder 31. The processing unit 16E further includes an elevator 1012 configured to move up and down the lid 1010.

Next, a removal process according to the sixth embodiment will be described. In the removal process according to the sixth embodiment, a liquid film of the removal solution is formed on the front surface of the wafer W subjected to the etching process, which is held by the holder 31 (in a liquid film forming process).

For example, a liquid film of the removal solution is formed on the wafer W by supplying the removal solution from the removal solution supply part 41 toward the wafer W and rotating the wafer W by the driver 33. Subsequently, after the liquid film forming process, the rotation of the wafer W is stopped, and the supply of the removal solution from the removal solution supply part 41 toward the wafer W is stopped. Subsequently, as illustrated in FIG. 18B, the lid 1010 is moved downward by the elevator 1012 so that the lid 1010 is brought into contact with the liquid film of removal solution. In the state in which the lid 1010 is in contact with the liquid film of the removal solution, the respective removal solution stays on the wafer W for a predetermined period of time while heating the removal solution using the heating part 1011 (in a maintenance process).

The present inventors have found that a gas is generated from the mixed solution when heating the mixed solution used as the removal solution. In addition, the present inventors have found that the reactivity between the mixed solution and the boron-based film 112 is reduced due to the gas being released from the mixed solution. Therefore, in the sixth embodiment, the gas is prevented from being released from the removal solution as much as possible by bringing the lid 1010 into contact with the liquid film of the removal solution to reduce the exposed area of the liquid film. Thus, it is possible to suppress a reduction in the reactivity of the removal solution due to the generation of the gas.

Thereafter, the heating by the heating part 1011 is stopped and the lid 1010 is moved upward by the elevator 1012. Subsequently, the holder 31 is rotated by the driver 33 to remove the removal solution from the wafer W. Subsequently, DIW used as a rinse solution is supplied from the DIW supply part 42 toward the wafer W to remove the removal solution remaining on the wafer W (in a rinsing process).

Subsequently, the rotation speed of the wafer W is increased to remove DIW from the wafer W and to dry the wafer W (in a drying process). Thereafter, the rotation of the wafer W is stopped and the wafer W is unloaded from the processing unit 16E. In this way, the substrate processing is completed.

In each of the aforementioned embodiments, the holder 31 that adsorptively holds the wafer W from below has been described as an example. However, the present disclosure is not limited thereto. For example, the removal process may be performed using a holder that grips the peripheral portion of the wafer W using the plurality of grippers 311, as in the substrate holding mechanism 30D2 illustrated in FIG. 17.

In each of the aforementioned embodiments, after the removal solution is supplied to the wafer W, the rinsing process and the drying process are performed. However, the present disclosure is not limited thereto. For example, in the case where the removal solution is a mixed solution, a process of supplying a nitric acid with respect to the wafer W may be performed after the removal solution is supplied to the wafer W and before the rinsing process is performed. For example, in the processing unit 16A illustrated in FIG. 12 or the processing unit 16B illustrated in FIG. 13, the valves 743 and 744 may be opened for a predetermined period of time, and subsequently, only the valve 743 may be closed and the valve 744 may be further kept opened for a predetermined period of time. Thus, the nitric acid can be supplied to the wafer W before the rinsing process.

Seventh Embodiment

Next, a seventh embodiment of the present disclosure will be described. FIG. 19 is a view illustrating an exemplary configuration of a substrate processing apparatus according to the seventh embodiment.

As illustrated in FIG. 19, a substrate processing apparatus 1H includes a carrier loading/unloading section 2002, a lot forming section 2003, a lot mounting section 2004, a lot transferring section 2005, a lot processing section 2006, and a controller 2007.

A plurality of carriers 2009 is loaded into and unloaded from the carrier loading/unloading section 2002. Each of the carriers 2009 accommodates a plurality of (e.g., 25) wafers W that is vertically arranged in a horizontal posture.

In the carrier loading/unloading section 2002, a carrier stage 2010 on which the plurality of carriers 2009 are mounted, and a carrier transfer mechanism 2011 for transferring the carrier 2009 are provided. In addition, carrier stocks 2012 and 2013 for temporarily storing the carrier 2009, respectively, and a carrier mounting table 2014 on which the carrier 2009 is mounted, are provided in the carrier loading/unloading section 2002. The carrier stock 2012 temporarily stores the wafers W (to be used as the final products) to be processed in the lot processing section 2006. The carrier stock 2013 temporarily stores the wafers W (to be used as the final products) which have been processed in the lot processing section 2006.

In the carrier loading/unloading section 2002, the carrier 2009 loaded into the carrier stage 2010 from the outside is transferred to the carrier stock 2012 or the carrier mounting table 2014 using the carrier transfer mechanism 2011. Furthermore, in the carrier loading/unloading section 2002, the carriers 2009 mounted on the carrier mounting table 2014 is transferred to the carrier stock 2013 or the carrier stage 2010 using the carrier transfer mechanism 2011. The carrier 2009 transferred to the carrier stage 2010 are transferred to the outside.

The lot forming section 2003 forms a lot of the plurality of (e.g., 50) wafers W which is to be simultaneously processed. The lot is formed by combining the wafers W accommodated in one or more carriers 2009. The lot may be formed so that front surfaces of the wafers W on each of which a pattern is formed, face each other. In some embodiments, the lot may be formed so that all the front surfaces of the wafers W each having a pattern formed therein are oriented in one direction.

A substrate transfer mechanism 2015 for transferring the plurality of wafers W is provided in the lot forming section 2003. The substrate transfer mechanism 2015 is configured to change the posture of the wafer W from the horizontal posture to the vertical posture and vice-versa during the transfer of the wafer W.

The lot forming section 2003 transfers the wafers W from the carrier 2009 mounted on the carrier mounting table 2014 to the lot mounting section 2004 using the substrate transfer mechanism 2015, and mounts the wafers W that form a lot, on the lot mounting section 2004. Furthermore, the lot forming section 2003 transfers the lot mounted on the lot mounting section 2004 to the carrier 2009 mounted on the carrier mounting table 2014 by the substrate transfer mechanism 2015. In addition, the substrate transfer mechanism 2015 includes a pre-processing substrate support part for supporting the wafers W before processing and a post-processing substrate support for supporting the wafers W after processing, which serves as two types of substrate support parts for supporting the plurality of wafers W. This prevents particles or the like adhering to wafers W or the like before processing from being moved and adhering to wafers W or the like after processing. The term "before processing" used herein refers to a state before the wafers W are transferred by the lot transferring section 2005, and the term "after processing" used herein refers to a state after the wafers W are transferred by the lot transferring section 2005.

The lot mounting section 2004 temporarily mounts (waits) the lot to be transferred between the lot forming section 2003 and the lot processing section 2006 on a lot mounting table 2016 by the lot transferring section 2005.

The lot mounting section 2004 includes a loading-side lot mounting table 2017 for mounting a before-processing lot (lot before being transferred by the lot transferring section 2005) thereon and an unloading-side lot mounting table 2018 for mounting an after-processing lot (lot after being transferred by the lot transferring section 2005) thereon. The plurality of wafers W corresponding to one lot are mounted to be arranged step by step in a vertical posture on the loading-side lot mounting table 2017 and the unloading-side lot mounting table 2018, respectively.

In the lot mounting section 2004, the lot formed by the lot forming section 2003 is mounted on the loading-side lot mounting table 2017, and is loaded into the lot processing section 2006 by the lot transferring section 2005. In the lot mounting section 2004, the lot unloaded from the lot processing section 2006 by the lot transferring section 2005 is mounted on the unloading-side lot mounting table 2018, and is transferred to the lot forming section 2003.

The lot transferring section 2005 transfers the lot between the lot mounting section 2004 and the lot processing section 2006 and within the lot processing section 2006.

The lot transferring section 2005 includes a lot transfer mechanism 2019 for transferring the lot. The lot transfer mechanism 2019 includes a rail 2020 disposed across the lot mounting section 2004 and the lot processing section 2006 along the X-axis direction, and a moving body 2021 that moves along the rail 2020 while holding the plurality of wafers W. The moving body 2021 includes a substrate holder 2022 configured to hold the plurality of wafers W that are arranged step by step in a vertical posture and to be movable forward and backward.

The lot transferring section 2005 receives the lot mounted on the loading-side lot mounting table 2017 using the substrate holder 2022 of the lot transfer mechanism 2019, and transfers the same to the lot processing section 2006. Furthermore, the lot transferring section 2005 receives the lot processed by the lot processing section 2006 using the substrate holder 2022 of the lot transfer mechanism 2019, and transfers the same to the unloading-side lot mounting table 2018. In addition, the lot transferring section 2005 transfers the lot within the lot processing section 2006 using the lot transfer mechanism 2019.

The lot processing section 2006 performs various processes such as etching, cleaning, drying and the like on the plurality of wafers W constituting one lot, which are arranged step by step in a vertical posture.

The lot processing section 2006 includes a processing unit 2023 for performing the drying process on the wafers W and a substrate holder cleaning unit 2024 for cleaning the substrate holder 2022. In addition, the lot processing section 2006 includes two processing units 2025 for performing a removal process of removing the boron-based film 112 (see FIG. 1A) from each wafer W and a particle removal process of removing particles adhering to each wafer W after the removal process. The processing unit 2023, the substrate holder cleaning unit 2024, and the two processing units 2025 are arranged side by side along the rail 2020 of the lot transferring section 2005.

The processing unit 2023 includes a substrate elevating mechanism 2028 configured to be moved up and down in a processing bath 2027. For example, IPA as a processing fluid for drying is supplied to the processing bath 2027. The substrate elevating mechanism 2028 holds the plurality of wafers W constituting one lot, which are arranged step by step in a vertical posture. The processing unit 2023 receives the lot held by the substrate holder 2022 of the lot transfer mechanism 2019 using the substrate elevating mechanism 2028, and moves the same up and down using the substrate elevating mechanism 2028 to dry the wafers W with the IPA supplied to the processing bath 2027. In addition, the processing unit 2023 transfers the lot from the substrate elevating mechanism 2028 to the substrate holder 2022 of the lot transfer mechanism 2019.

The substrate holder cleaning unit 2024 is configured to supply a processing solution for cleaning and a drying gas to a processing bath 2029. The substrate holder cleaning unit 2024, supplies the processing solution for cleaning followed by the drying gas with respect to the substrate holder 2022 of the lot transfer mechanism 2019 to clean the substrate holder 2022.

The processing unit 2025 includes a processing bath 2030 in which the removal process is performed and a processing bath 2031 in which the particle removal process is performed. The removal solution is stored in the processing bath 2030. For example, rinse solutions such as DIW, in addition to SC1 or ammonium hydroxide diluted with water to a predetermined concentration (hereinafter, referred to as "diluted ammonia water"), are sequentially stored in the processing bath 2031. Substrate elevating mechanisms 2032 and 2033 are provided in the respective processing baths 2030 and 2031 so as to be moved up and down.

Each of the substrate elevating mechanisms 2032 and 2033 holds the plurality of wafers W corresponding to one lot, which are arranged step by step in a vertical posture. First, the processing unit 2025 receives the lot held by the substrate holder 2022 of the lot transfer mechanism 2019 using the substrate elevating mechanism 2032 and moves the lot down using the substrate elevating mechanism 2032 to dip the lot in the removal solution stored in the processing bath 2030. As a result, the boron-based film 112 is removed from the wafer W.

Thereafter, the processing unit 2025 transfers the lot from the substrate elevating mechanism 2032 to the substrate holder 2022 of the lot transfer mechanism 2019. Furthermore, the processing unit 2025 receives the lot from the substrate holder 2022 of the lot transfer mechanism 2019 using the substrate elevating mechanism 2033. In addition, the processing unit 2025 moves the lot down using the substrate elevating mechanism 2033 to dip the lot in DIW stored in the processing bath 2031. Thus, the wafers W are subjected to the rinsing process. Subsequently, the processing unit 2025 discharges the DIW from the processing bath 2031 and stores the SC1 or the diluted ammonia water in the processing bath 2031 to dip the lot in the SC1 or the diluted ammonia water. Subsequently, the processing unit 2025 discharges the SC1 or the diluted ammonia water from the processing bath 2031 and stores the DIW in the processing bath 2031 again to dip the lot in the DIW. Thus, the wafers W are subjected to the rinsing process. Thereafter, the processing unit 2025 transfers the lot from the substrate elevating mechanism 2033 to the substrate holder 2022 of the lot transfer mechanism 2019.

The controller 2007 controls operations of the respective parts (the carrier loading/unloading section 2002, the lot forming section 2003, the lot mounting section 2004, the lot transferring section 2005, the lot processing section 2006, and the like) of the substrate processing apparatus 1H.

The controller 2007 is, for example, a computer, and includes a non-transitory computer-readable storage medium 2038. A program for controlling various processes performed in the substrate processing apparatus 1H is stored in the storage medium 2038. The controller 2007 controls the operation of the substrate processing apparatus 1H by reading the program stored in the storage medium 2038 and executing the same. Furthermore, the program is stored in the computer-readable storage medium 2038 and may be installed in the storage medium 2038 of the controller 2007 from another storage medium. Examples of the computer-readable storage medium 2038 include a hard disk (HD), a flexible disk (FD), a compact disc (CD), a magneto-optical disc (MO), a memory card, and the like.

Figure 20:
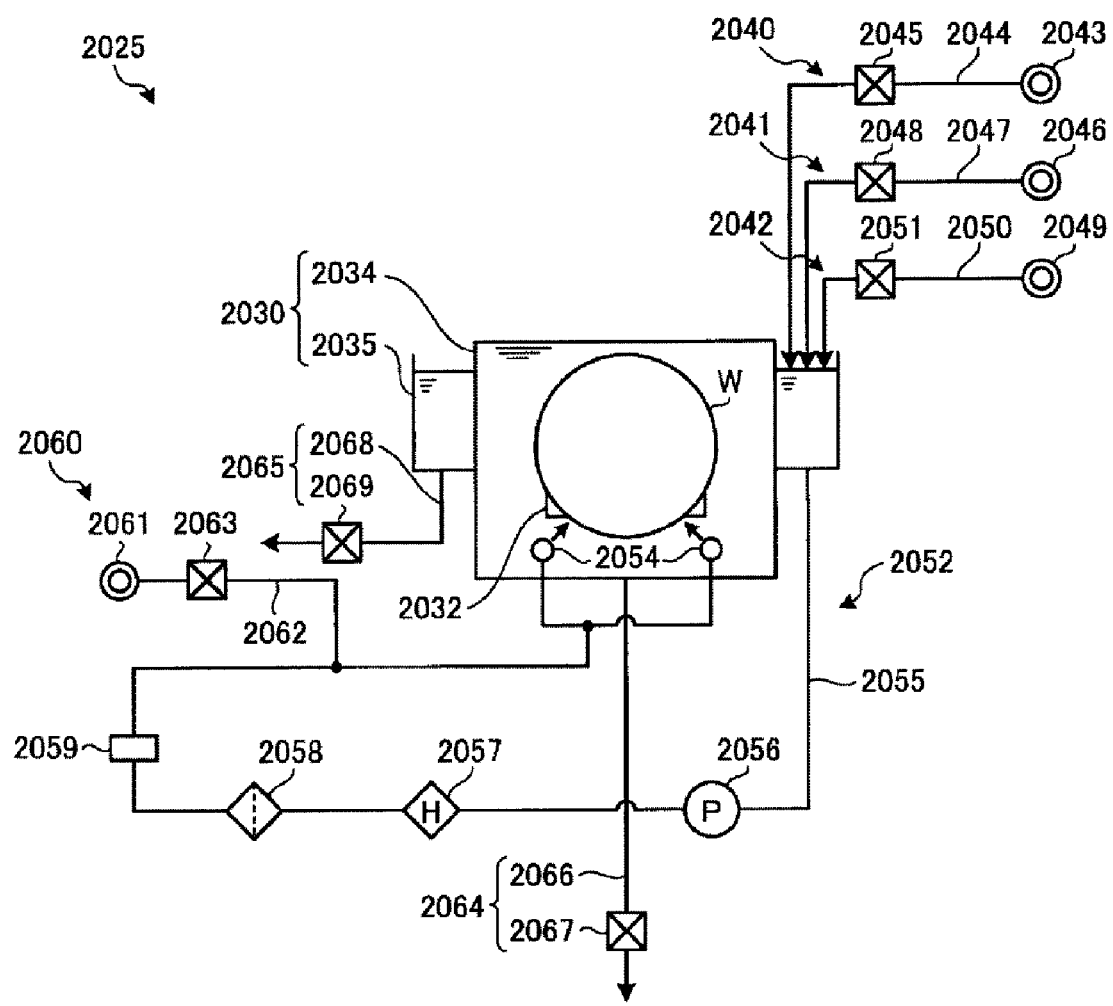
FIG. 20 is a view illustrating an exemplary configuration of a processing bath in which a removal process is performed, and the vicinity of the processing unit.

Next, an exemplary configuration of the processing unit 2025 will be described. First, an exemplary configuration of the processing bath 2030 in which the removal process is performed, and the vicinity of the processing unit 2025 will be described with reference to FIG. 20. FIG. 20 is a view illustrating an exemplary configuration of the processing bath 2030 in which the removal processing is performed, and the vicinity of the processing bath 2030.

As illustrated in FIG. 20, the processing bath 2030 included in the processing unit 2025 includes an inner tank 2034, and an outer tank 2035 provided adjacent to the inner tank 2034 around an upper portion of the inner tank 2034. Upper portions of the inner tank 2034 and the outer tank 2035 are opened. The removal solution overflows from the upper portion of the inner tank 2034 into the outer tank 2035.

The processing unit 2025 includes a DIW supply part 2040 for supplying DIW to the processing bath 2030, a nitric acid supply part 2041 for supplying a nitric acid to the processing bath 2030, and a sulfuric acid supply part 2042 for supplying a sulfuric acid to the processing bath 2030.

The DIW supply part 2040 includes a DIW source 2043, a DIW supply passage 2044, and a valve 2045. When the valve 2045 is brought from a closed state into an open state, DIW is supplied from the DIW source 2043 to the outer tank 2035 of the processing bath 2030 via the DIW supply passage 2044.

The nitric acid supply part 2041 includes a nitric acid source 2046, a nitric acid supply passage 2047, and a valve 2048. The nitric acid source 2046 is a tank for storing a nitric acid diluted to a predetermined concentration with water (DIW). For example, a nitric acid diluted to a concentration of 69% with water is stored in the nitric acid source 2046. When the valve 2048 is brought from a closed state into an open state, the diluted nitric acid is supplied from the nitric acid source 2046 to the outer tank 2035 of the processing bath 2030 via the nitric acid supply passage 2047.

The sulfuric acid supply part 2042 includes a sulfuric acid source 2049, a sulfuric acid supply passage 2050, and a valve 2051. The sulfuric acid source 2049 is a tank for storing a sulfuric acid diluted to a predetermined concentration with water (DIW). For example, a sulfuric acid diluted to a concentration of 96 to 98% with water is stored in the sulfuric acid source 2049. When the valve 2051 is brought from a closed state into an open state, the diluted sulfuric acid is supplied from the sulfuric acid source 2049 to the outer tank 2035 of the processing bath 2030 via the sulfuric acid supply passage 2050.

The nitric acid and the sulfuric acid supplied into the outer tank 2035 while being diluted to the respective predetermined concentrations, are mixed with each other inside the outer tank 2035 to produce the removal solution having a desired concentration. The outer tank 2035 corresponds to an example of a mixer that mixes the water-diluted sulfuric acid flowing through the sulfuric acid supply passage 2050 (an example of a strong acid supply passage) and the water-diluted nitric acid flowing through the nitric acid supply passage 2047.

In addition, the processing unit 2025 includes a circulation part 2052 configured to discharge the removal solution stored in the processing bath 2030 from the processing bath 2030 and returns the same to the processing bath 2030.

Specifically, the circulation part 2052 includes a nozzle 2054, a circulation passage 2055, a pump 2056, a heating part 2057, a filter 2058, and a nitric acid concentration detection part 2059.

The nozzle 2054 is disposed below the wafers W held by the substrate elevating mechanism 2032 (see FIG. 19) inside the inner tank 2034. The nozzle 2054 has a cylindrical shape extending in the arrangement direction of the plurality of wafers W. Furthermore, the nozzle 2054 includes a plurality of discharge holes formed on its circumferential surface. The nozzle 2054 is configured to discharge the removal solution from the plurality of discharge holes toward the wafers W held by the substrate elevating mechanism 2032. Thus, the nozzle 2054 corresponds to an example of a removal solution supply part that supplies the removal solution produced by the outer tank 2035 (an example of the mixer) toward the wafers W.

Both end portions of the circulation passage 2055 are connected to the bottom of the outer tank 2035 and the nozzle 2054, respectively. The pump 2056, the heating part 2057, and the filter 2058 are sequentially provided in the circulation passage 2055. The circulation part 2052 circulates the removal solution from the outer tank 2035 to the inner tank 2034 by driving the pump 2056. At this time, the removal solution is heated to a predetermined temperature by the heating part 2057 so that impurities are removed by the filter 2058.

The removal solution produced in the outer tank 2035 flows through the circulation passage 2055, and is discharged from the nozzle 2054 into the inner tank 2034. Thus, the removal solution is stored in the inner tank 2034. In addition, the removal solution discharged into the inner tank 2034 overflows from the inner tank 2034 to the outer tank 2035 and flows from the outer tank 2035 to the circulation passage 2055 again. Thus, a circulation flow of the removal solution is formed.

The nitric acid concentration detection part 2059, which is provided in the circulation passage 2055, detects a nitric acid concentration of the removal solution flowing through the circulation passage 2055 and outputs the detection result to the controller 2007.

In addition, the processing unit 2025 includes a concentration adjusting solution supply part 2060. The concentration adjusting solution supply part 2060 supplies a nitric acid as a concentration adjusting solution for adjusting the concentration of the removal solution. The concentration adjusting solution supply part 2060 includes a nitric acid source 2061, a nitric acid supply passage 2062, and a valve 2063. When valve 2063 is brought from a closed state into an open state, the nitric acid is supplied from the nitric acid source 2061 to the circulation passage 2055 via the nitric acid supply passage 2062. Thus, the concentration of the removal solution can be stabilized earlier by supplying the concentration adjusting solution to the circulation passage 2055.

In addition, the processing unit 2025 includes a first processing solution discharging part 2064 for discharging the removal solution from the inner tank 2034, and a second processing solution discharging part 2065 for discharging the removal solution from the outer tank 2035.

The first processing solution discharging part 2064 includes a drainage passage 2066 that connects the bottom of the inner tank 2034 and an external drainage pipe, and a valve 2067 for opening and closing the drainage passage 2066. The second processing solution discharging part 2065 includes a drainage passage 2068 that connects the bottom of the outer tank 2035 and an external drainage pipe, and a valve 2069 for opening and closing the drainage passage 2068.

The valves 2045, 2048, 2051, 2063, 2067, and 2069, the pump 2056, and the heating part 2057 included in the processing unit 2025 are controlled by the controller 2007.

As described above, the substrate processing apparatus 1H according to the seventh embodiment is configured to remove the boron-based film 112 from the wafers W by dipping the wafers W in the removal solution stored in the processing bath 2030.

As described above, in the case where the removal solution is a mixed solution, the removal efficiency of the boron-based film 112 can be further enhanced by continuing to bring the same removal solution into contact with the wafers W, compared with the case where the supply of the removal solution to the wafers W is continued (i.e., a case where the removal solution is continuously substituted with another solution). Thus, as in the substrate processing apparatus 1H according to the seventh embodiment, it is possible to enhance the removal efficiency of the boron-based film 112 by dipping the wafers W in the removal solution stored in the processing bath 2030 while circulating the removal solution using the circulation part 2052. In addition, it is possible to reduce an amount of the used removal solution.

Furthermore, the removal solution to be supplied to the wafers W can be maintained at a constant temperature by heating the removal solution flowing through the circulation passage 2055 using the heating part 2057. This makes it possible to suppress degradation in the removal performance caused by a decrease in temperature of the removal solution.

In addition, when the concentration of the removal solution detected by the nitric acid concentration detection part 2059 falls below a threshold, the controller 2007 of the substrate processing apparatus 1H supplies the nitric acid to the circulation passage 2055 by opening the valve 2063 of the concentration adjusting solution supply part 2060. Thus, it is possible to suppress the concentration of the nitric acid from being decreased due to volatilization of the nitric acid from the removal solution.

Meanwhile, the circulation passage 2055 is formed by, for example, a pipe having high corrosion resistance, such as a fluorine resin. Thus, a nitric acid gas generated from the mixed solution used as the removal solution may pass through the pipe, thereby corroding an external member.

For this reason, in the substrate processing apparatus 1H, the circulation passage 2055 is provided to have a double pipe structure. The interior of the pipe is purged to suppress the leakage of the nitric acid gas to the outside of the circulation passage 2055.

Figure 21:
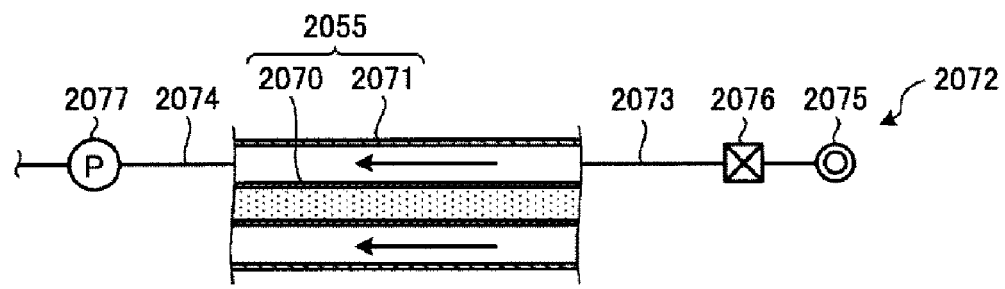
FIG. 21 is a view illustrating an exemplary configuration of a circulation passage.

This point will be described with reference to FIG. 21. FIG. 21 is a view illustrating an exemplary configuration of the circulation passage 2055.

As illustrated in FIG. 21, the circulation passage 2055 having a double pipe structure includes an inner pipe 2070 and an outer pipe 2071 disposed outside the inner pipe 2070. The inner pipe 2070 and the outer pipe 2071 are formed of, for example, a member having high corrosion resistance, such as a fluorine resin.

Both end portions of the inner pipe 2070 are connected to the bottom of the outer tank 2035 and the nozzle 2054 to allow the removal solution to flow therethrough.

A purging part 2072 is connected to the outer pipe 2071. The purging part 2072 includes an upstream pipe 2073 connected to an upstream side of the outer pipe 2071 and a downstream pipe 2074 connected to a downstream side of the outer pipe 2071. A fluid source 2075 for supplying a purging fluid to the upstream pipe 2073 and a valve 2076 for opening and closing the upstream pipe 2073 are provided in the upstream pipe 207. A pump 2077 is provided in the downstream pipe 2074. The purging fluid may be a gas such as air or a liquid such as water.

The purging part 2072 supplies the purging fluid supplied from the fluid source 2075 to the outer pipe 2071 via the upstream pipe 2073. Furthermore, the purging part 2072 discharges the purging fluid supplied to the outer pipe 2071 to the external pipe via the downstream pipe 2074 by the pump 2077. Therefore, the nitric acid gas passing through the inner pipe 2070 is discharged to the external pipe together with the purging fluid. Thus, it is possible to suppress the nitric acid gas generated from the removal solution from leaking outward of the circulation passage 2055.

While in FIG. 20, the exemplary configuration in which the removal solution is a mixed solution has been described, the removal solution may be a hydrogen peroxide solution. In this case, the processing unit 2025 may include a hydrogen peroxide solution supply part instead of the nitric acid supply part 2041 and the sulfuric acid supply part 2042. The hydrogen peroxide solution supply part may include, for example, a hydrogen peroxide solution source, a hydrogen peroxide solution supply passage, and a valve. Furthermore, in the case where the removal solution is a hydrogen peroxide solution, the processing unit 2025 may include a hydrogen peroxide concentration detection part instead of the nitric acid concentration detection part 2059, and a hydrogen peroxide source for supplying an undiluted solution of the hydrogen peroxide instead of the nitric acid source 2061.

Figure 22:
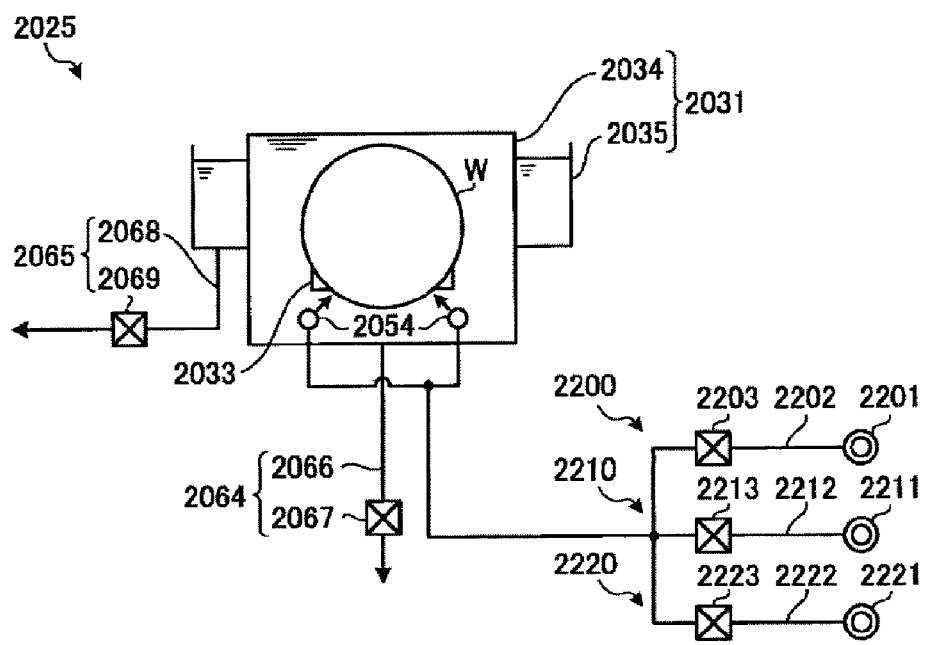
FIG. 22 is a view illustrating an exemplary configuration of a processing bath in which a particle removal process is performed, and the vicinity of the processing unit.

Next, an exemplary configuration of the processing bath 2031 in which the particle removal process is performed, and the vicinity of the processing bath 2031 will be described with reference to FIG. 22. FIG. 22 is a diagram illustrating an exemplary configuration of the processing bath 2031 in which the particle removal process is performed, and the vicinity of the processing bath 2031.

As illustrated in FIG. 22, similar to the processing bath 2030, the processing bath 2031 of the processing unit 2025 includes an inner tank 2034 and an outer tank 2035. A nozzle 2054 is provided inside the inner tank 2034. Furthermore, similar to the processing bath 2030, a first processing solution discharging part 2064 and a second processing solution discharging part 2065 are provided in the processing bath 2031.

A DIW supply part 2200, an $NH_4OH$ supply part 2210, and a hydrogen peroxide solution supply part 2220 are provided in the processing bath 2031. The DIW supply part 2200 includes a DIW source 2201, a DIW supply passage 2202 through which DIW supplied from the DIW source 2201 flows, and a valve 2203 for opening and closing the DIW supply passage 2202. The DIW supply part 2200 supplies the DIW supplied from the DIW source 2201 to the nozzle 2054 via the DIW supply passage 2202.

The $NH_4OH$ supply part 2210 includes an $NH_4OH$ source 2211, an $NH_4OH$ supply passage 2212 through which $NH_4OH$ supplied from the $NH_4OH$ source 2211 flows, and a valve 2213 for opening and closing the $NH_4OH$ supply passage 2212. The $NH_4OH$ supply part 2210 supplies the $NH_4OH$ supplied from the $NH_4OH$ source 2211 to the nozzle 2054 via the $NH_4OH$ supply passage 2212.

The hydrogen peroxide solution supply part 2220 includes a hydrogen peroxide solution source 2221, a hydrogen peroxide solution supply passage 2222 through which the hydrogen peroxide solution supplied from the hydrogen peroxide solution source 2221 flows, and a valve 2223 for opening and closing the hydrogen peroxide solution supply passage 2222. The hydrogen peroxide solution supply part 2220 supplies the hydrogen peroxide solution supplied from the hydrogen peroxide solution source 2221 to the nozzle 2054 via the hydrogen peroxide solution supply passage 2222.

When DIW is supplied as a rinse solution, the valve 2203 is opened with the valves 2213 and 2223 closed. Thus, DIW is supplied from the nozzle 2054 to the inner tank 2034.

On the other hand, when a diluted ammonia water is supplied as the particle removal solution, the valves 2203 and 2213 are opened with the valve 2223 closed. Thus, DIW supplied from the DIW source 2201 and the NH$_4$OH supplied from the NH$_4$OH source 2211 are mixed with each other, so that the diluted ammonia water thus obtained is supplied from the nozzle 2054 into the inner tank 2034. A flow rate adjustment mechanism (not shown) is provided in each of the DIW supply passage 2202 and the NH$_4$OH supply passage 2212. Flow rates of DIW and NH$_4$OH are adjusted by the respective flow rate adjustment mechanism so that DIW and NH$_4$OH are mixed with each other in a desired ratio.

In addition, when SC1 is supplied as the particle removal solution, the valves 2203, 2213 and 2223 are opened. Thus, DIW supplied from the DIW source 2201, NH$_4$OH supplied from the NH$_4$OH source 2211, and the hydrogen peroxide solution supplied from hydrogen peroxide solution source 2221 are mixed with each other, so that SC1 thus obtained is supplied from the nozzle 2054 in to the inner tank 2034. A flow rate adjustment mechanism (not shown) is provided in each of the DIW supply passage 2202, the NH$_4$OH supply passage 2212 and the hydrogen peroxide solution supply passage 2222. Flow rates of the DIW, the NH$_4$OH and the hydrogen peroxide solution are adjusted by the respective flow rate adjustment mechanism so that the DIW, the NH$_4$OH and the hydrogen peroxide solution are mixed with each other in a desired ratio.

The valves 2067, 2069, 2203, 2213 and 2223 and the flow rate adjustment mechanisms (not shown) are controlled to be opened and closed by the controller 2007.

In the processing bath 2031, a so-called point-of-use (POU) type process is performed, in which a plurality of processes for the wafers W are performed in a single tank by sequentially supplying and draining DIW as the rinse solution and the diluted ammonia water or SC1 as the particle removal solution. This point will be described later.

Figure 23:
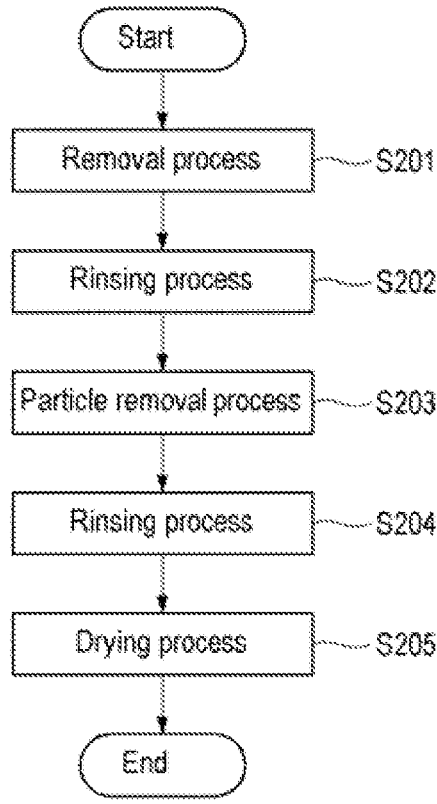
FIG. 23 is a flowchart illustrating an example of a substrate processing procedure performed by the substrate processing apparatus according to the seventh embodiment.

Next, an example of a specific operation of the substrate processing apparatus 1H will be described with reference to FIG. 23. FIG. 23 is a flowchart illustrating an example of a substrate processing procedure performed by the substrate processing apparatus 1H according to the seventh embodiment. The processing procedure illustrated in FIG. 23 is executed under the control of the controller 2007. Processes illustrated in FIG. 23 are performed after the film forming process of step S101 and the etching process of step S102 illustrated in FIG. 11 are executed.

As illustrated in FIG. 23, in the substrate processing apparatus 1H, a removal process is performed on the wafers W after the etching process (in step S201).

In the removal process, the processing unit 2025 receives the lot from the substrate holder 2022 of the lot transfer mechanism 2019 using the substrate elevating mechanism 2032 and moves the lot down using the substrate elevating mechanism 2032 to dip the lot in the removal solution stored in the processing bath 2030. Thus, the boron-based film 112 is removed from the wafers W.

Thereafter, the processing unit 2025 discharges the lot from the processing bath 2030 using the substrate elevating mechanism 2032 and transfers the same to the substrate holder 2022 of the lot transfer mechanism 2019.

Subsequently, in the substrate processing apparatus 1H, a rinsing process is performed (in step S202). In the rinsing process, the processing unit 2025 receives the lot from the substrate holder 2022 of the lot transfer mechanism 2019 using the substrate elevating mechanism 2033 and moves the same down using the substrate elevating mechanism 2033 to dip the lot in DIW stored in the processing bath 2031. Thus, the removal solution is removed from the wafers W.

DIW overflowing from the inner tank 2034 to the outer tank 2035 is discharged from the second processing solution discharging part 2065 to an external drainage pipe. Thus, fresh DIW is always supplied to the plurality of wafers W.

Thereafter, the processing unit 2025 discharges the DIW from the processing bath 2031 by closing the valve 2203 of the DIW supply part 2200 and opening the valve 2067 of the first processing solution discharging part 2064 for a predetermined period of time.

Subsequently, in the substrate processing apparatus 1H, a particle removal process is performed (in step S203). In the particle removal process, for example, the processing unit 2025 opens the valve 2203 of the DIW supply part 2200, the valve 2213 of the NH$_4$OH supply part 2210, and the valve 2223 of the hydrogen peroxide solution supply part 2220. Therefore, SC1 is stored in the inner tank 2034 of the processing bath 2031 so that the lot disposed in the inner tank 2034 is dipped in SC1. Thus, particles are removed from the wafers W. SC1 overflowing from the inner tank 2034 to the outer tank 2035 is discharged from the second processing solution discharging part 2065 to an external drainage pipe. Thus, fresh SC1 is always supplied to the plurality of wafers W.

In some embodiments, the processing unit 2025 may include an ultrasonic vibration part that applies ultrasonic vibration to the inner tank 2034. In this case, the processing unit 2025 applies the ultrasonic vibration to the inner tank 2034 using the ultrasonic vibration part in the particle removal process. This makes it possible to apply a physical force caused by the ultrasonic vibration, in addition to a chemical action (etching action) of SC1, to the wafers W, thus enhancing the removal efficiency of particles.

Thereafter, the processing unit 2025 closes the valves 2203, 2213 and 2223, and opens the valve 2067 of the first processing solution discharging part 2064 for a predetermined period of time to discharge SC1 from the processing bath 2031.

In some embodiments, in the particle removal process, the diluted ammonia water may be stored in the inner tank 2034 by opening the valve 2203 of the DIW supply part 2200 and the valve 2213 of the NH$_4$OH supply part 2210.

Subsequently, in the substrate processing apparatus 1H, a rinsing process is performed (in step S204). In the rinsing process, the processing unit 2025 opens the valve 2203 of the DIW supply part 2200 and stores DIW in the inner tank 2034 of the processing bath 2031 to dip the lot disposed in the inner tank 2034 in DIW. Thus, SC1 is removed from the wafers W.

Thereafter, the processing unit 2025 transfers the lot from the substrate elevating mechanism 2033 to the substrate holder 2022 of the lot transfer mechanism 2019.

Subsequently, in the substrate processing apparatus 1H, a drying process is performed (in step S205). In the drying process, the processing unit 2023 receives the lot from the substrate holder 2022 of the lot transfer mechanism 2019 using the substrate elevating mechanism 2028 and moves the same down using the substrate elevating mechanism 2028 to dip the lot in IPA stored in the processing bath 2027. Thus, DIW is removed from the wafers W. Thereafter, the processing unit 2023 moves the lot using the substrate elevating mechanism 2028. Thus, the IPA remaining on the wafers W volatilizes to dry the wafers W.

Thereafter, the processing unit 2023 transfers the lot from the substrate elevating mechanism 2028 to the substrate holder 2022 of the lot transfer mechanism 2019. The lot transfer mechanism 2019 mounts the lot on the lot mounting section 2004. Thereafter, the lot forming section 2003 transfers the lot mounted on the lot mounting section 2004 to the carrier 2009 mounted on the carrier mounting table 2014 by the substrate transfer mechanism 2015. The carrier loading/unloading section 2002 transfers the carrier 2009 mounted on the carrier mounting table 2014 to the carrier stage 2010 using the carrier transfer mechanism 2011. Thus, a series of substrate processes performed in the substrate processing apparatus 1H are completed. The carrier 2009 transferred to the carrier stage 2010 are unloaded to the outside.

Figure 24:
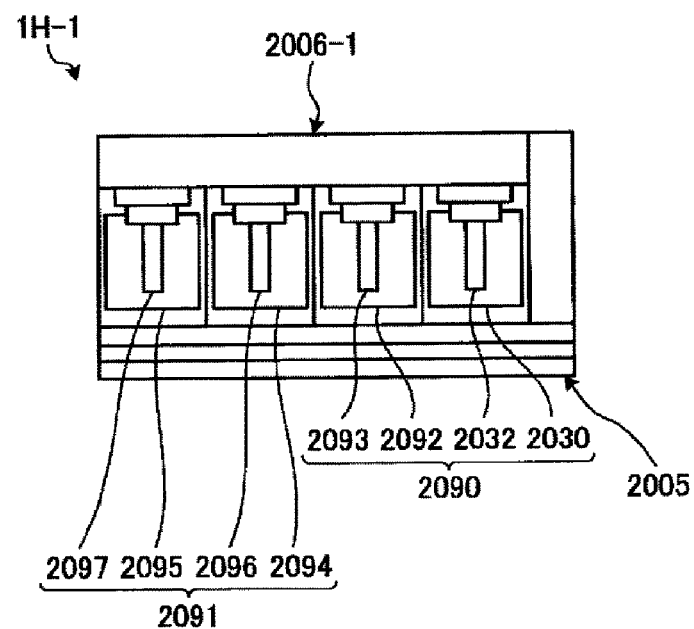
FIG. 24 is a view illustrating an exemplary configuration of a substrate processing apparatus according to a modification of the seventh embodiment.
Figure 25:
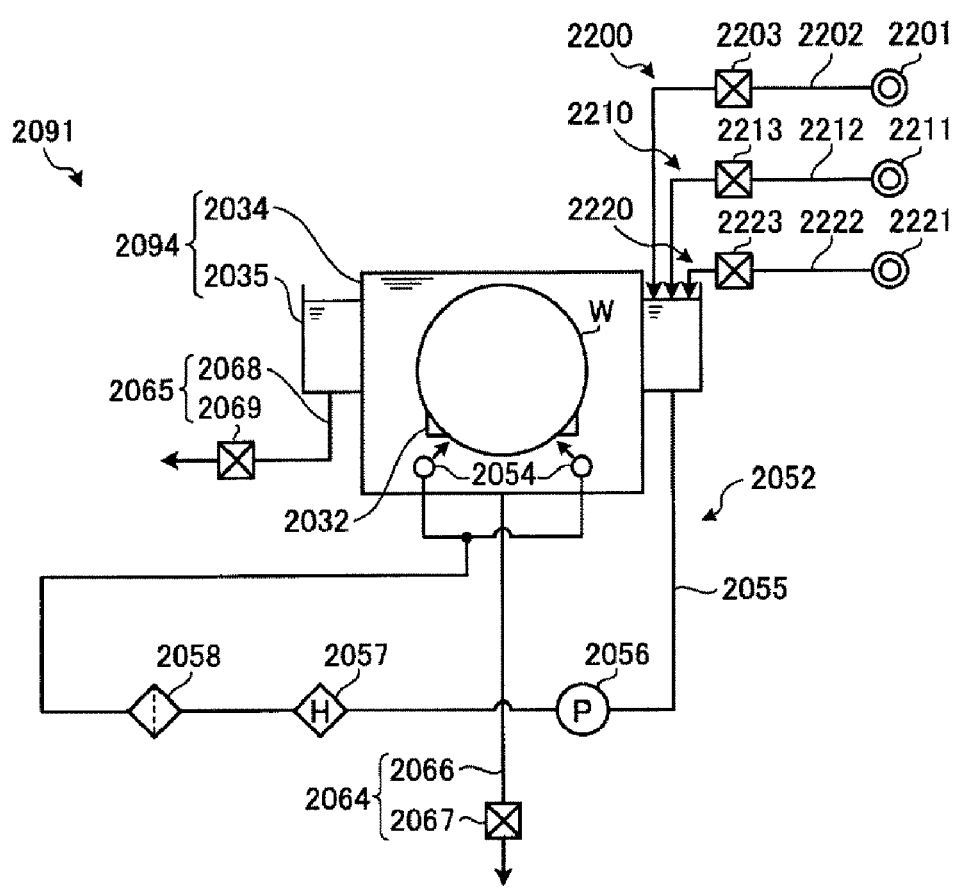
FIG. 25 is a view illustrating an exemplary configuration of a processing bath in which a particle removal process is performed in a processing unit according to the modification, and the vicinity of the processing unit.

Next, a modification of the aforementioned substrate processing apparatus 1H will be described with reference to FIG. 24. FIG. 24 is a view illustrating an exemplary configuration of a substrate processing apparatus according to a modification of the seventh embodiment. FIG. 25 is a diagram illustrating configurations of a processing bath in which a particle removal process is performed in a processing unit 2091 according to the modification, and the vicinity of the processing bath. In FIG. 24, a portion of the configuration of the lot processing part is mainly omitted. The configuration other than the lot processing part is similar to that of the substrate processing apparatus 1H.

As illustrated in FIG. 24, a substrate processing apparatus 1H-1 according to the modification includes a lot processing section 2006-1.

The lot processing section 2006-1 includes a processing unit 2090 that performs a removal process and a subsequent rinsing process, and a processing unit 2091 that performs a particle removal process and a subsequent rinsing process.

The processing unit 2090 includes a processing bath 2030 in which the removal process is performed and a processing bath 2092 in which the rinsing process is performed. Similar to the processing baths 2030 and 2031, the processing bath 2092 includes an inner tank 2034 and an outer tank 2035. A peripheral configuration of the processing bath 2092 is similar to the configuration illustrated in FIG. 22 except that the $NH_4OH$ supply part 2210 and the hydrogen peroxide solution supply part 2220 are removed. A substrate elevating mechanism 2093 is provided in the processing bath 2092 so as to be moved up and down.

The processing unit 2091 includes a processing bath 2094 in which the particle removal process is performed and a processing bath 2095 in which the rinsing process is performed.

As illustrated in FIG. 25, the processing bath 2094 includes an inner tank 2034 and an outer tank 2035. A nozzle 2054 and a first processing solution discharging part 2064 are provided in the inner tank 2034, and a second processing solution discharging part 2065 is provided in the outer tank 2035.

The processing unit 2091 includes a DIW supply part 2200, an $NH_4OH$ supply part 2210, and a hydrogen peroxide solution supply part 2220. The DIW supply part 2200, the $NH_4OH$ supply part 2210, and the hydrogen peroxide solution supply part 2220 respectively supply DIW, $NH_4OH$ and a hydrogen peroxide solution to the outer tank 2035. DIW and $NH_4OH$ are supplied to the outer tank 2035 where they are mixed with each other to produce a diluted ammonia water. Furthermore, DIW, $NH_4OH$ and the hydrogen peroxide solution are supplied to the outer tank 2035 where they are mixed with each other to produce SC1.

In addition, the processing unit 2091 includes a circulation part 2052. A pump 2056, a heating part 2057, and a filter 2058 are provided in the circulation passage 2055 of the circulation part 2052. The circulation part 2052 drives the pump 2056 to allow SC1 or the diluted ammonia water to circulate from the outer tank 2035 to the processing bath 2094. At this time, the SC1 or the diluted ammonia water is heated to a predetermined temperature by the heating part 2057, so that impurities are removed by the filter 2058.

A configuration of the processing bath 2095 and the vicinity thereof is similar to that of the processing bath 2092 and the vicinity thereof. Substrate elevating mechanisms 2096 and 2097 are provided in the processing baths 2094 and 2095 so as to be moved up and down.

In the substrate processing apparatus 1H-1 configured as above, the removal process and the subsequent rinsing process, and the particle removal process and the subsequent rinsing process are performed in the processing baths 2030, 2092, 2094, and 2095, respectively. This eliminates the need to perform the process of discharging DIW and storing SC1 or the diluted ammonia water, and the process of discharging SC1 or the diluted ammonia water and storing DIW as in the substrate processing apparatus 1. It is therefore possible to reduce the time required for these processes.

In addition, in the substrate processing apparatus 1H-1 according to the modification, the SC1 or the diluted ammonia water used in the particle removal process (in step S203) is circulated and reused. This makes it possible to reduce the amount of the SC1 or the diluted ammonia water used in the particle removal process.

As described above, the processing units 2025 and 2090 of the substrate processing apparatuses 1H and 1H-1 according to the seventh embodiment and the modification includes the process bath 2030 for storing the removal solution, and the substrate elevating mechanism 2032 that is disposed above the processing bath 2030 and is configured to move the wafers W up and down while holding the wafers W. After the removal solution is stored in the processing bath 2030, the controller 2007 of the substrate processing apparatuses 1H and 1H-1 dips the wafers W in the removal solution stored in the processing bath 2030 using the substrate elevating mechanism 2032.

Therefore, according to the substrate processing apparatuses 1H and 1H-1 of the seventh embodiment and the modification, in the case where the removal solution is a mixed solution, the removal efficiency of the boron-based film 112 from the wafers W can be enhanced, compared with the case where the mixed solution is continuously substituted with another solution. In addition, it is possible to reduce the amount of the used removal solution.

As described above, the substrate processing method according to an embodiment of the present disclosure includes the production process and the removal process. In the production process, $B(OH)_3$ or $B_2O_3$ is produced by bringing the oxidizing agent OX into contact with the boron-based film 112 in the substrate (as an example, the wafer W) in which the boron-based film 112 is formed on a film including a silicon-based film (as an example, the silicon oxide film 111). In the removal process, the boron-based film 112 is removed from the substrate by dissolving $B(OH)_3$ or $B_2O_3$ produced in the production process in water.

Thus, the boron-based film 112 can be appropriately removed from the substrate by oxidizing boron in the boron-based film 112 to produce $B(OH)_3$ or $B_2O_3$ and dissolving the produced $B(OH)_3$ or $B_2O_3$ in water.

In the production process, $B(OH)_3$ or $B_2O_3$ may be produced by bringing an ozone-containing aqueous solution into contact with the boron-based film 112. In this case, in the removal process, $B(OH)_3$ or $B_2O_3$ produced in the production process may be dissolved in water contained in the ozone-containing aqueous solution.

By allowing hydroxy radicals produced in the process of ozone decomposition reaction to react with the boron, it is possible to produce $B(OH)_3$ or $B_2O_3$ having water solubility. In addition, $B(OH)_3$ or $B_2O_3$ can be dissolved using water contained in ozone water. By doing so, the boron-based film 112 can be appropriately removed from the substrate.

In addition, the substrate processing method according to an embodiment of the present disclosure may include a heating process of heating the ozone-containing aqueous solution.

By heating the ozone-containing aqueous solution, it is possible to increase the etching rate of the boron-based film 112.

Moreover, the substrate processing method according to an embodiment of the present disclosure may include a holding process of holding the substrates in a horizontal posture. In this case, the production process may include a process of bring the ozone-containing aqueous solution into contact with the boron-based film 112 by supplying the ozone-containing aqueous solution to the substrate held in the holding process using a supply part (as an example, the removal solution supply part 41). The supply part includes the nozzle 411 for discharging the ozone-containing aqueous solution, and the nozzle arm 412 which supports the nozzle 411 and has a supply passage (as one example, the removal solution supply passage 721) of the ozone-containing aqueous solution formed therein. Furthermore, in the heating process, the ozone-containing aqueous solution flowing through the supply passage may be heated using the heating part 731 provided in the nozzle arm 412.

By providing the heating part 731 inside the nozzle arm 412, the ozone water can be heated immediately before being discharged to the substrate. Thus, it is possible to suppress the hydroxy radicals from being deactivated before reaching the boron-based film 112 on the substrate.

In some embodiments, in the production process, $B(OH)_3$ or $B_2O_3$ may be produced by bringing a hydrogen peroxide solution into contact with the boron-based film 112. In this case, in the removal process, $B(OH)_3$ or $B_2O_3$ produced in the production process may be dissolved in water contained in the hydrogen peroxide solution.

Boron is oxidized by the oxidation action of the hydrogen peroxide. Thus, $B(OH)_3$ or $B_2O_3$ having water solubility can be produced. In addition, $B(OH)_3$ or $B_2O_3$ can be dissolved in water contained in the hydrogen peroxide solution. By doing so, the boron-based film 112 can be appropriately removed from the substrate. Furthermore, the hydrogen peroxide solution is advantageous in terms of handling and safety, for example, because it has relatively low toxicity to the human body.

The concentration of the hydrogen peroxide in the hydrogen peroxide solution may fall within a range of from 16.5 wt % to 35 wt %.

By setting the concentration of hydrogen peroxide within the range, the production of $B(OH)_3$ or $B_2O_3$ and the dissolution of the produced $B(OH)_3$ or $B_2O_3$ can be realized in a balanced manner, thus appropriately removing the boron-based film 112 from the substrate.

In the production process, $B(OH)_3$ or $B_2O_3$ may be produced by bringing a mixed solution of a nitric acid, a strong acid stronger than the nitric acid, and water into contact with the boron-based film 112. In this case, in the removal process, $B(OH)_3$ or $B_2O_3$ produced in the production process may be dissolved in water contained in the mixed solution.

By reacting nitronium ions produced by dehydration of the nitric acid with boron, $B(OH)_3$ or $B_2O_3$ having water solubility may be produced. In addition, $B(OH)_3$ or $B_2O_3$ may be dissolved in water contained in the mixed solution. By doing so, the boron-based film 112 can be appropriately removed from the substrate.

The strong acid may be a sulfuric acid having a concentration of 64 wt % or less. In this case, the concentration of the sulfuric acid may fall within a range of from 3 wt % to 69 wt %. By setting the concentration of the sulfuric acid within the range, the boron-based film 112 can be appropriately removed from the substrate.

According to the present disclosure in some embodiments, it is possible to appropriately remove a boron-based film from a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
a production process of producing $B(OH)_3$ or $B_2O_3$ by bringing an ozone-containing aqueous solution into contact with a boron-based film in a substrate in which the boron-based film is formed on a film including a silicon-based film;
a removal process of removing the boron-based film from the substrate by dissolving the $B(OH)_3$ or $B_2O_3$ produced in the production process in water; and
a heating process of heating the ozone-containing aqueous solution,
wherein the removal process includes dissolving the $B(OH)_3$ or $B_2O_3$ produced in the production process in the water contained in the ozone-containing aqueous solution, and
wherein, in the heating process, the ozone-containing aqueous solution is heated immediately before being supplied to the substrate.

2. The method of claim 1, further comprising: a holding process of holding the substrate in a horizontal posture; and
wherein the production process includes bringing the ozone-containing aqueous solution into contact with the boron-based film by supplying the ozone-containing aqueous solution to the substrate held in the holding process using a supply part, the supply part being provided with a nozzle configured to discharge the ozone-containing aqueous solution and a nozzle arm configured to support the nozzle, the nozzle arm having a supply passage of the ozone-containing aqueous solution formed therein,
wherein the heating process includes heating the ozone-containing aqueous solution flowing through the supply passage using a heating part provided in the nozzle arm.

* * * * *